United States Patent
Fukuda

(10) Patent No.: US 10,818,879 B2
(45) Date of Patent: Oct. 27, 2020

(54) ORGANIC EL DISPLAY PANEL MANUFACTURING METHOD

(71) Applicant: JOLED INC., Tokyo (JP)

(72) Inventor: Toshio Fukuda, Kanagawa (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/430,313

(22) Filed: Jun. 3, 2019

(65) Prior Publication Data

US 2020/0035958 A1    Jan. 30, 2020

(30) Foreign Application Priority Data

Jul. 27, 2018    (JP) .................. 2018-141161

(51) Int. Cl.
| | | |
|---|---|---|
| H01L 51/56 | (2006.01) | |
| H01L 51/00 | (2006.01) | |
| H01L 27/32 | (2006.01) | |

(52) U.S. Cl.
CPC .......... *H01L 51/56* (2013.01); *H01L 51/0005* (2013.01); *H01L 27/3246* (2013.01); *H01L 2227/323* (2013.01)

(58) Field of Classification Search
None
See application file for complete search history.

(56) References Cited

U.S. PATENT DOCUMENTS

| | | |
|---|---|---|
| 5,443,922 A | 8/1995 | Nishizaki et al. |
| 2004/0201048 A1* | 10/2004 | Seki .................. H01L 51/0005 257/294 |
| 2010/0221855 A1* | 9/2010 | Yamazaki .......... H01L 27/3246 438/29 |
| 2015/0137087 A1* | 5/2015 | Yamamoto ......... H01L 51/0004 257/40 |
| 2017/0058140 A1* | 3/2017 | Imamura ............ H01L 51/0005 |
| 2018/0030296 A1* | 2/2018 | Fujii ..................... C09D 11/36 |

(Continued)

FOREIGN PATENT DOCUMENTS

| | | |
|---|---|---|
| JP | H5-163488 A | 6/1993 |
| JP | 2002-515585 A | 5/2002 |
| JP | 2007-90200 A | 4/2007 |

(Continued)

*Primary Examiner* — Angel Roman
(74) *Attorney, Agent, or Firm* — Hauptman Ham, LLP

(57) ABSTRACT

A method of manufacturing an organic electroluminescence display panel includes: forming pixel electrodes in matrix on a substrate; arranging column banks extending in column direction above the substrate along row direction, the banks each being between adjacent pixel electrodes in the row direction; applying ink containing organic light emitting material to gaps between adjacent banks, the applied ink being continuous in the column direction; reducing pressure of atmosphere including the substrate to first pressure while positioning a rectifying plate at first distance from upper surface of the substrate, the plate covering region with the ink applied on the substrate; reducing, after the reducing, the pressure to second pressure, which is lower than the first pressure, or lower while positioning the plate at second distance, which is greater than the first distance, from the surface; heating the substrate to form organic functional layer; and forming counter electrode above the functional layer.

8 Claims, 23 Drawing Sheets

(56) References Cited

U.S. PATENT DOCUMENTS

| | | |
|---|---|---|
| 2018/0097205 A1 | 4/2018 | Shimamura et al. |
| 2018/0123076 A1 | 5/2018 | Fukuda et al. |

FOREIGN PATENT DOCUMENTS

| | | |
|---|---|---|
| JP | 2010-267428 A | 11/2010 |
| JP | 2011-25244 A | 2/2011 |
| JP | 2013-250002 A | 12/2013 |
| JP | 2014-199805 A | 10/2014 |
| JP | 2014-199806 A | 10/2014 |
| JP | 2014-238194 A | 12/2014 |
| JP | 2015-68513 A | 4/2015 |
| JP | 2017-67343 A | 4/2017 |
| JP | 2017-73397 A | 4/2017 |
| JP | 2018-49806 A | 3/2018 |
| JP | 2018-59697 A | 4/2018 |
| JP | 2018-78094 A | 5/2018 |
| WO | 99/60319 A1 | 11/1999 |

\* cited by examiner

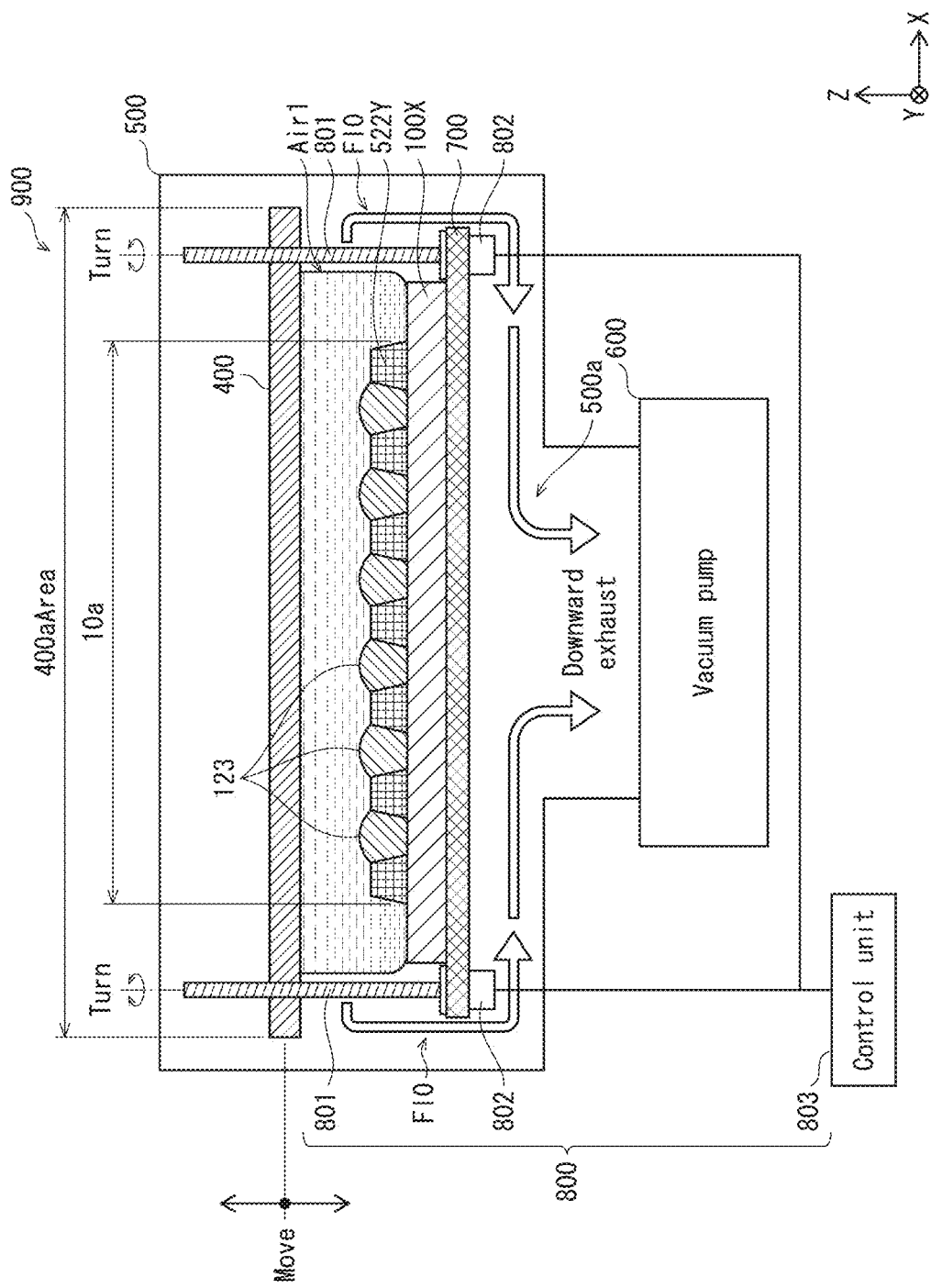

FIG. 13A
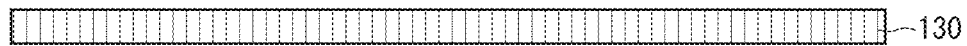
FIG. 13B
FIG. 13C
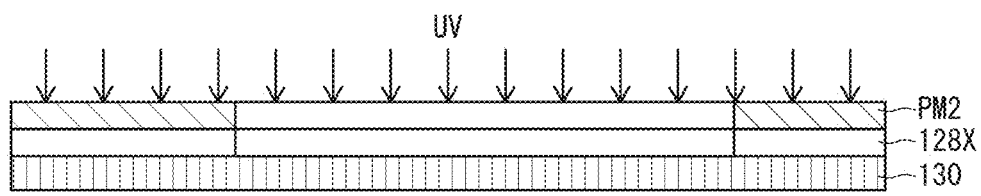
FIG. 13D
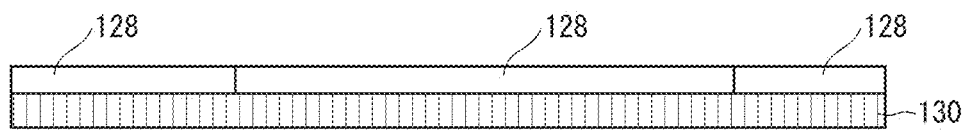
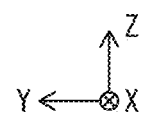

Immediately after ink ejection

After time Tini

ORGANIC EL DISPLAY PANEL MANUFACTURING METHOD

This application claims priority to Japanese Patent Application No. 2018-141161 filed Jul. 27, 2018, the contents of which are hereby incorporated by reference in their entirety.

BACKGROUND OF THE DISCLOSURE

Technical Field

The present disclosure relates to methods of manufacturing organic electroluminescence (EL) display panels that use organic EL elements that make use of electroluminescence of organic material, and ink drying devices usable in such methods.

Description of the Related Art

Recently, organic EL display panels in which organic EL elements are arranged in a matrix on a substrate are being realized as display panels used in display devices such as digital televisions. In such organic EL display panels, each organic EL element emits light and therefore visibility is high.

Recently, as display devices have increased in size, a wet process has been proposed as an efficient method of forming a functional film, in which ink containing a functional material is applied based on a method such as an inkjet method. A wet process has merit in that positional precision when separately applying functional films does not depend on substrate size, and therefore the technical barrier to increasing display device size is relatively low. In a typical inkjet wet process, a substrate to which ink is to be applied is placed on a work table of an application device. An inkjet head is scanned over a surface of the substrate in one direction, and ink is dropped from nozzles of the inkjet head to a predefined region of the surface of the substrate. Subsequently, solvent of the ink is evaporated and the ink dried to form a functional film.

In a wet process, a functional layer is formed by applying ink onto a substrate and drying the ink. Drying the ink includes evaporating and drying the solvent. Solvent vapor pressure is lower in a peripheral portion of a film forming area than in a central portion thereof, and therefore an evaporation rate of the solvent is greater in the peripheral portion of the film forming area. As a result, there is a tendency that film thickness of a functional layer of a pixel formed in a central portion of the substrate and film thickness of a functional layer of a pixel formed in an end portion of the substrate are different from each other. Thus, when film thickness of functional layers differs between pixels of the central portion of the substrate and pixels of a peripheral portion of the substrate, properties of the functional layers are different from each other. Differences in properties of the functional layers cause in-plane luminance nonuniformity in an organic EL display panel.

As a response to this, for example, JP2010-267428 describes a functional film forming method in which ink is dried while a rectifying plate covers a substrate, the rectifying plate having openings only at both ends thereof in a direction of extension of line banks. Further, JP2007-90200 describes a drying method of exhausting ink solvent to an upper side of a substrate by using a rectifying plate having a through hole. Moreover, JP2017-67343 describes a dry processing method in which a substrate is held at a first height while pressure in a process container is from atmospheric pressure to 500 Pa, and the substrate is held at a second height lower than the first height while the pressure in the process container is 3 Pa or lower. According to the method of JP2017-67343, an influence of moisture mixed in a process container is alleviated in dry processing of organic material films.

SUMMARY

A method of manufacturing an organic EL display panel according to at least one aspect of the present disclosure is a method of manufacturing an organic electroluminescence (EL) display panel. The method includes forming pixel electrodes in a matrix on a substrate, wherein the matrix comprises rows and columns. The method further includes arranging column banks, which extend in a column direction, above the substrate along a row direction, wherein each of the column banks is between adjacent pixel electrodes in the row direction. The method further includes applying ink containing organic light emitting material to gaps between adjacent column banks, wherein the applied ink is continuous in the column direction. The method further includes reducing a pressure of an atmosphere including the substrate to a first pressure while positioning a rectifying plate at a first distance from an upper surface of the substrate, wherein the rectifying plate covers a region with the ink applied on the substrate in a plan view. The method further includes reducing, after the reducing of the pressure of the atmosphere to the first pressure, the pressure of the atmosphere to a second pressure or lower while positioning the rectifying plate at a second distance from the upper surface of the substrate, wherein the second pressure is lower than the first pressure, and the second distance is greater than the first distance. The method further includes heating the substrate to form an organic functional layer. The method further includes forming a counter electrode above the organic functional layer.

BRIEF DESCRIPTION OF DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIG. 5 is a schematic cross section of an ink drying device 900 usable in a method of manufacturing organic EL display panel 10 according to at least one embodiment;

FIG. 6A is a perspective view and FIG. 6B is a plan view of the substrate 100x seen through the rectifying plate 400;

FIG. 13A to FIG. 13D are schematic cross sections showing states in manufacture of a CF substrate 131 in manufacture of the organic EL display panel 10 according to at least one embodiment;

DETAILED DESCRIPTION

Figure 1:
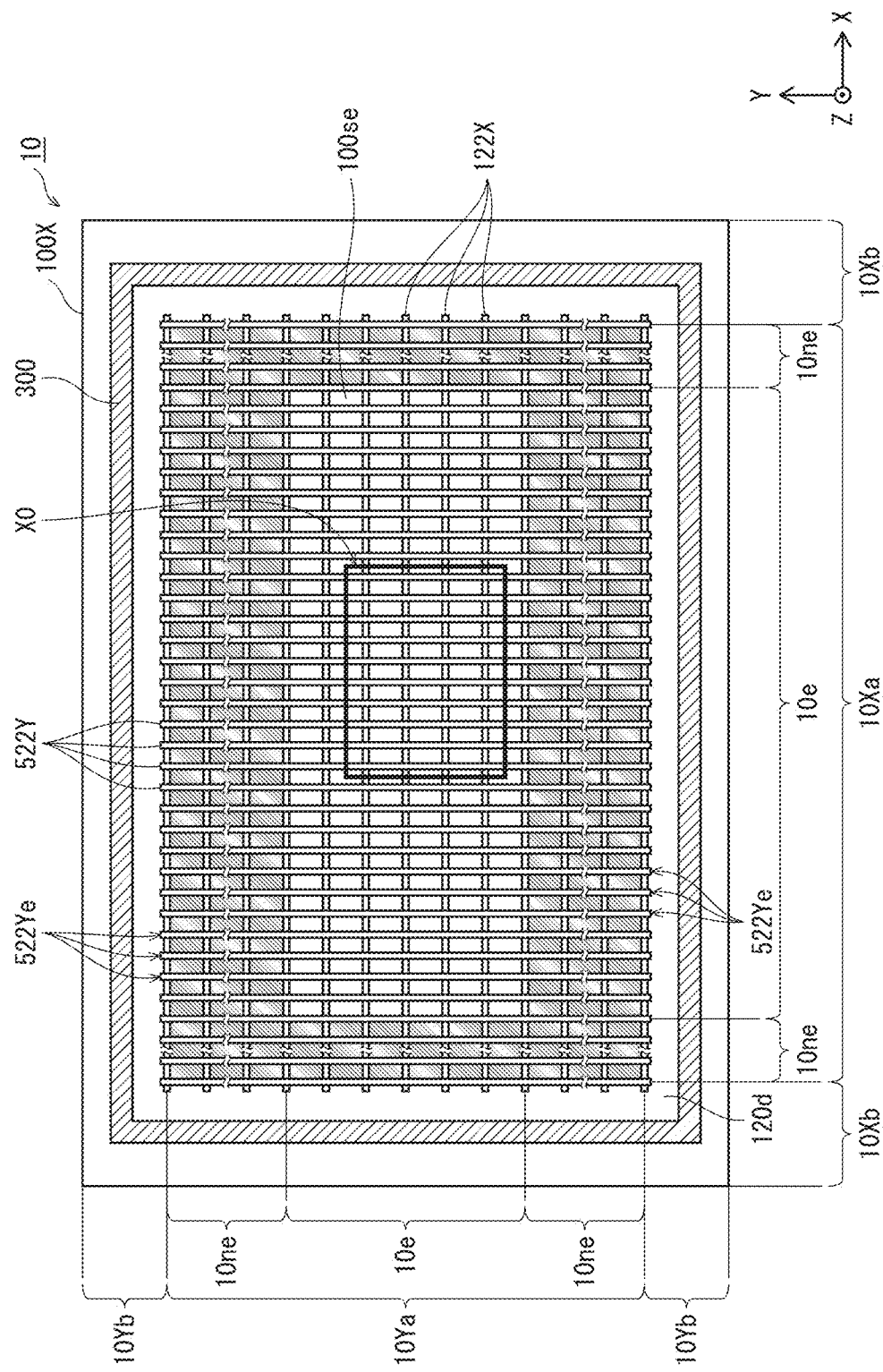
FIG. 1 is a schematic plan view of an organic EL display panel 10 manufactured by a method of manufacturing organic EL display panel 10 according to at least one embodiment.

As panel resolution increases, conventional display panel manufacturing methods have a problem. Specifically, in a method of forming light emitting layers by applying ink containing organic light emitting material to column shaped application regions constituted from gaps between adjacent ones of elongated banks, functional layers have nonuniform film thickness in the column shaped application regions on a substrate due to an uneven vapor pressure distribution of ink vapor. This causes nonuniformity in luminance. In this method of forming light emitting layers by applying ink to elongated column shaped application regions, the applied ink is continuous mainly in a column direction, and thus film thickness variation at column direction ends easily influences an inward region including a display region. The above problem occurs in this way.

The present disclosure includes an organic EL display panel manufacturing method for improving luminance uniformity across the organic EL display panel by equalizing film thickness of light emitting layers in column shaped application regions on a substrate.

The method of manufacturing an organic EL display panel according to at least one embodiment is a method of manufacturing an organic electroluminescence (EL) display panel. The method includes forming pixel electrodes in a matrix on a substrate, wherein the matrix comprises rows and columns. The method further includes arranging column banks, which extend in a column direction, above the substrate along a row direction, wherein each of the column banks is between adjacent pixel electrodes in the row direction. The method further includes applying ink containing organic light emitting material to gaps between adjacent column banks, wherein the applied ink is continuous in the column direction. The method further includes reducing a pressure of an atmosphere including the substrate to a first pressure while positioning a rectifying plate at a first distance from an upper surface of the substrate, wherein the rectifying plate covers a region with the ink applied on the substrate in a plan view. The method further includes reducing, after the reducing of the pressure of the atmosphere to the first pressure, the pressure of the atmosphere to a second pressure or lower while positioning the rectifying plate at a second distance from the upper surface of the substrate, wherein the second pressure is lower than the first pressure, and the second distance is greater than the first distance. The method further includes heating the substrate to form an organic functional layer. The method further includes forming a counter electrode above the organic functional layer.

According to the method of manufacturing an organic EL display panel in which light emitting layers 123 are formed by applying ink containing organic light emitting material to column shaped application regions constituted from gaps 522z between adjacent ones of elongated banks 522Y so that the applied ink is continuous, the heating of the substrate alleviates causes of film thickness variation caused by the applied ink being continuous mainly in the column direction. Thus, film shape and film thickness of light emitting layers formed in the column shaped application regions become uniform in both peripheral portions and central portions of a film forming area. This makes film thickness more uniform for the light emitting layers in the column shaped application regions on the substrate, thereby improving luminance uniformity across the organic EL display panel.

According to at least one embodiment of the method, the first pressure is $1 \times 10^4$ Pa to $5 \times 10^4$ Pa, and the first distance is 2 mm to 10 mm. According to at least one embodiment of the method, a ratio of the first distance to a width of a range including the column banks on the substrate is 5/2000 to 5/100.

With this configuration, solution of problems is possible, such as imbalance in solvent evaporation rate due to uneven vapor concentration distribution of ink solvent in central and peripheral portions of a substrate, imbalance of ink surface tension in the column shaped application regions, and insufficient levelling of ink ejection amounts after ejection in the column shaped application regions.

According to at least one embodiment of the method, the second pressure is $1 \times 10^{-1}$ Pa, and the second distance is 30 mm to 70 mm.

With this configuration, causes of film thickness variation are alleviated, such as steam flow turbulence in a space between a substrate and a rectifying plate and variation in cross sectional shape of film caused by decrease in solvent evaporation rate.

According to at least one embodiment of the method, the pressure of the atmosphere reaches the first pressure in a time from 1 sec after start of the reduction of the pressure of the atmosphere to 300 sec at a maximum after the start. According to at least one embodiment of the method, the reducing of the pressure of the atmosphere to the first pressure promotes levelling of the ink applied onto the substrate, and the reducing of the pressure of the atmosphere to the second pressure promotes evaporation of solvent of the ink. According to at least one embodiment of the method, the rectifying plate is disposed opposite the column banks. According to at least one embodiment of the method, a height of the rectifying plate relative to the substrate is varied by an elevation unit.

This configuration realizes the method of manufacturing an organic EL display panel in which film shape and film thickness of light emitting layers formed in the column shaped application regions become uniform in both peripheral portions and central portions of a film forming area, and thus film thickness of light emitting layers becomes uniform in the column shaped application regions.

<Overall Configuration of Display Panel 10>
[Overview]

A display panel 10 according to at least one embodiment is described with reference to the drawings. The drawings are schematic diagrams and actual scale may differ.

FIG. 1 is a schematic plan view of the display panel 10 according to at least one embodiment.

The display panel 10 is an organic EL display panel that uses electroluminescence of an organic compound, has organic EL display elements 100, which form pixels, disposed in a matrix on a substrate 100x (thin film transistor (TFT) substrate) on which TFTs are arranged. The display panel 10 has a top-emission configuration, emitting light from an upper surface. Here, in the present disclosure, an X direction, Y direction, and L direction in FIG. 1 correspond to a row direction, column direction, and thickness direction of the display panel 10, respectively.

In FIG. 1, the display panel 10 has a partitioned region 10a (the X direction and the Y direction are labelled 10Xa and 10Ya, respectively, and 10a is used where the distinction is unnecessary) in which column banks 522Y and row banks 122X are disposed, partitioning the substrate 100x into a matrix and defining light emitting units of each color RGB, and a non-partitioned region 10b (the X direction and the Y direction are labelled 10Xb and 10Yb, respectively, and 10b is used where the distinction is unnecessary) surrounding the partitioned region 10a. Outer peripheral edges in the column direction of the partitioned region 10a correspond to column-direction ends 522Ye in the column direction of the column banks 522Y. In the non-partitioned region 10b is formed a sealing member 300 that is rectangular and surrounds the partitioned region 10a. Further, the partitioned region 10a includes a display element region 10e including a substrate center and a non-light emitting region 10ne surrounding the display element region 10e. The display element region 10e is a region in which the organic EL display element 100 is formed in each section defined by the column banks 522Y and the row banks 122X; and the non-light emitting region 10ne is a region in which the organic EL display element 100 is not formed in each section. Further, in at least one embodiment, length in the X and Y directions of the non-light emitting region 10ne is from two to ten times length in the X and Y directions of a sub pixel 100se region surrounded by adjacent ones of the column banks 522Y and adjacent ones of the row banks 122X. According to at least one embodiment, the length is four times greater in both the X and Y directions.

<Configuration of Display Element Region 10e>

Figure 2:
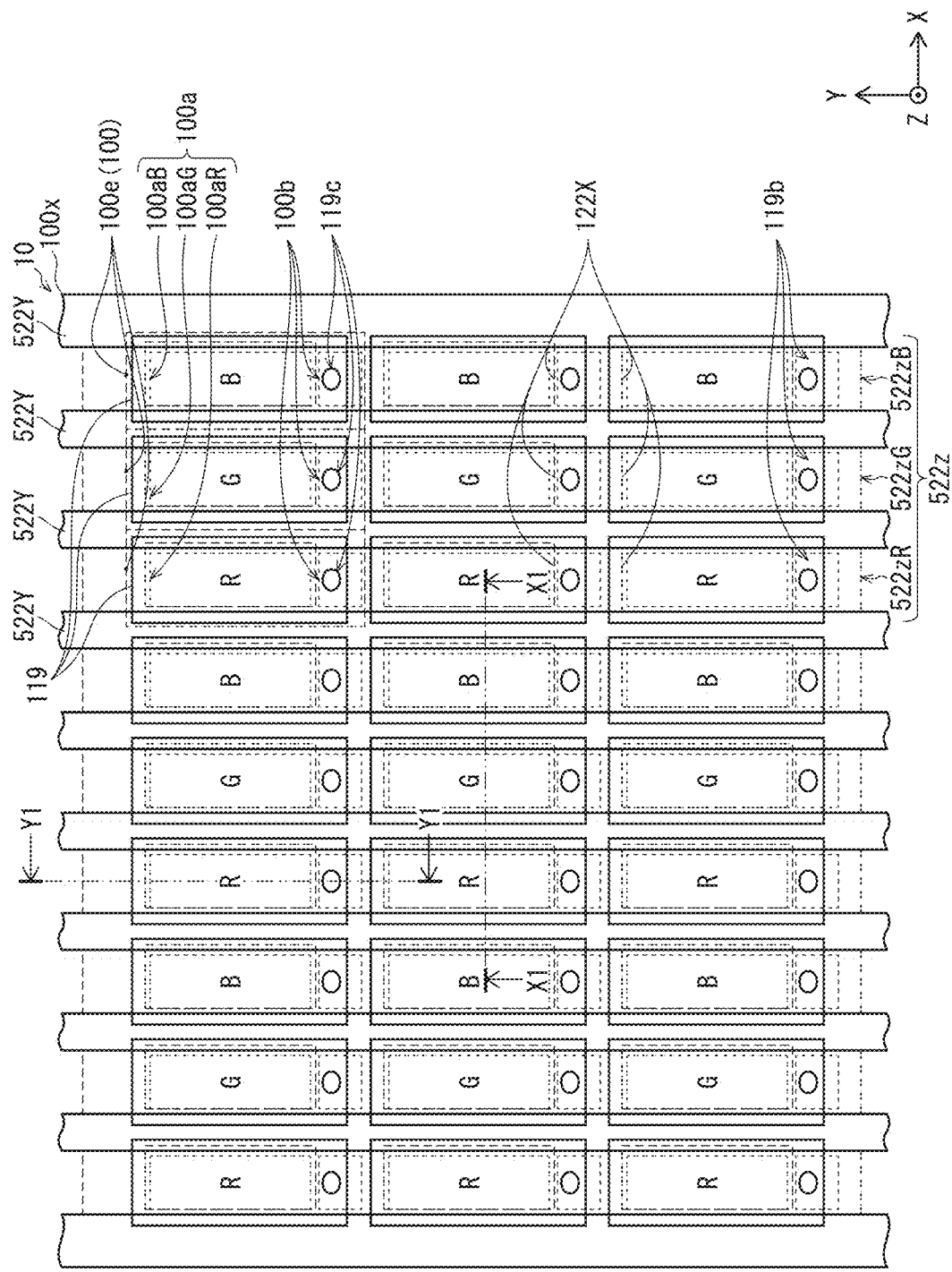
FIG. 2 is an enlarged plan view of a portion X0 in FIG. 1 according to at least one embodiment.

FIG. 2 is an enlarged plan view of portion X0 in FIG. 1 according to at least one embodiment.

In the display element region 10e of the display panel 10, unit pixels 100e corresponding to the organic EL display element 100 are arranged in a matrix. In each of the unit pixels 100e are three auto light emitting regions 100a, which are regions that emit light via an organic compound, a red light emitting region 100aR, a green light emitting region 100aG, and a blue light emitting region 100aB (hereinafter, where a distinction between 100aR, 100aG, and 100aB is not necessary, 100a is used). That is, three sub pixels 100se corresponding to auto light emitting regions 100aR, 100aG, and 100aB lined up in the row direction in FIG. 2 are one set, and make up one of the unit pixels 100e in a color display.

Further, in FIG. 2, pixel electrodes 119 are arranged in a matrix on the substrate 100x in a state of being separated from each other by predefined distances in the row and column directions of the display panel 10. Each of the pixel electrodes 119 has a rectangular shape in plan view. The pixel electrodes 119 arranged in a matrix correspond to the three auto light emitting regions 100aR, 100aG, 100aB lined up in the row direction.

In the display panel 10, shapes of the banks 122 are that of a so-called line-like insulating layer form. The column banks 522Y extend in the column direction (Y direction in FIG. 2) and are lined up in the row direction above regions on the substrate 100x between outer edges in the row direction of two adjacent ones of the pixel electrodes 119 in the row direction.

On the other hand, the row banks 122X extend in the row direction (X direction in FIG. 2) and are lined up in the column direction above regions on the substrate 100x between outer edges in the column direction of two adjacent ones of the pixel electrodes 119 in the column direction. A region in which the row banks 122X are formed becomes a non-auto light emitting region 100b, because organic electroluminescence does not occur in light emitting layers 123 above the pixel electrodes 119. Thus, edges in the column direction of the auto light emitting regions 100a are defined by edges in the column direction of the row banks 122X.

Where a gap 522z between adjacent ones of the column banks 522Y is defined, a red gap 522zR corresponding to the auto light emitting region 100aR, a green gap 522zG corresponding to the auto light emitting region 100aG, or a blue gap 522zB corresponding to the auto light emitting region 100aB exists (hereinafter, where distinction between gap 522zR, gap 522zG, and gap 522zB is not required, "gap 522z" is used), and in the display panel 10 the column banks 522Y and the gaps 522z alternate in the row direction.

Further, in FIG. 2, in the display panel 10, the auto light emitting regions 100a and the non-auto light emitting regions 100b alternate in the column direction along the gap 522z. In the non-auto light emitting region 100b, there is a connecting recess 119c (contact hole) that connects one of the pixel electrodes 119 to a source of a TFT, and a contact region 119b (contact window) on the pixel electrode 119 for electrical connection to the pixel electrode 119.

Further, for one sub pixel 100se, the column banks 522Y and the row banks 122X intersect, and the auto light emitting region 100a is disposed between the row banks 122X in the column direction.

<Component Configuration of Display Panel 10>

Figure 3:
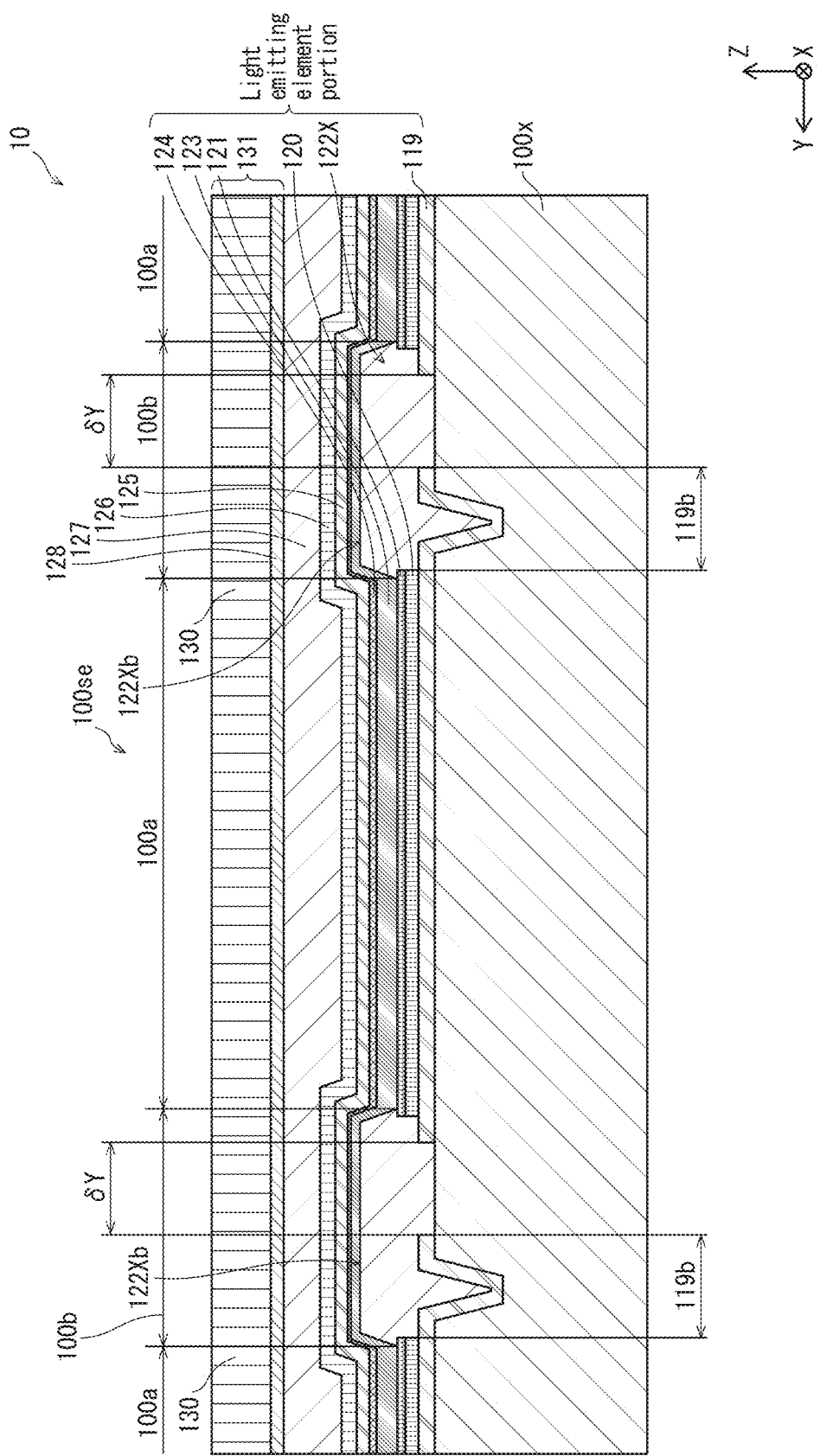
FIG. 3 is a schematic cross section taken along Y1-Y1 in FIG. 2 according to at least one embodiment.
Figure 4:
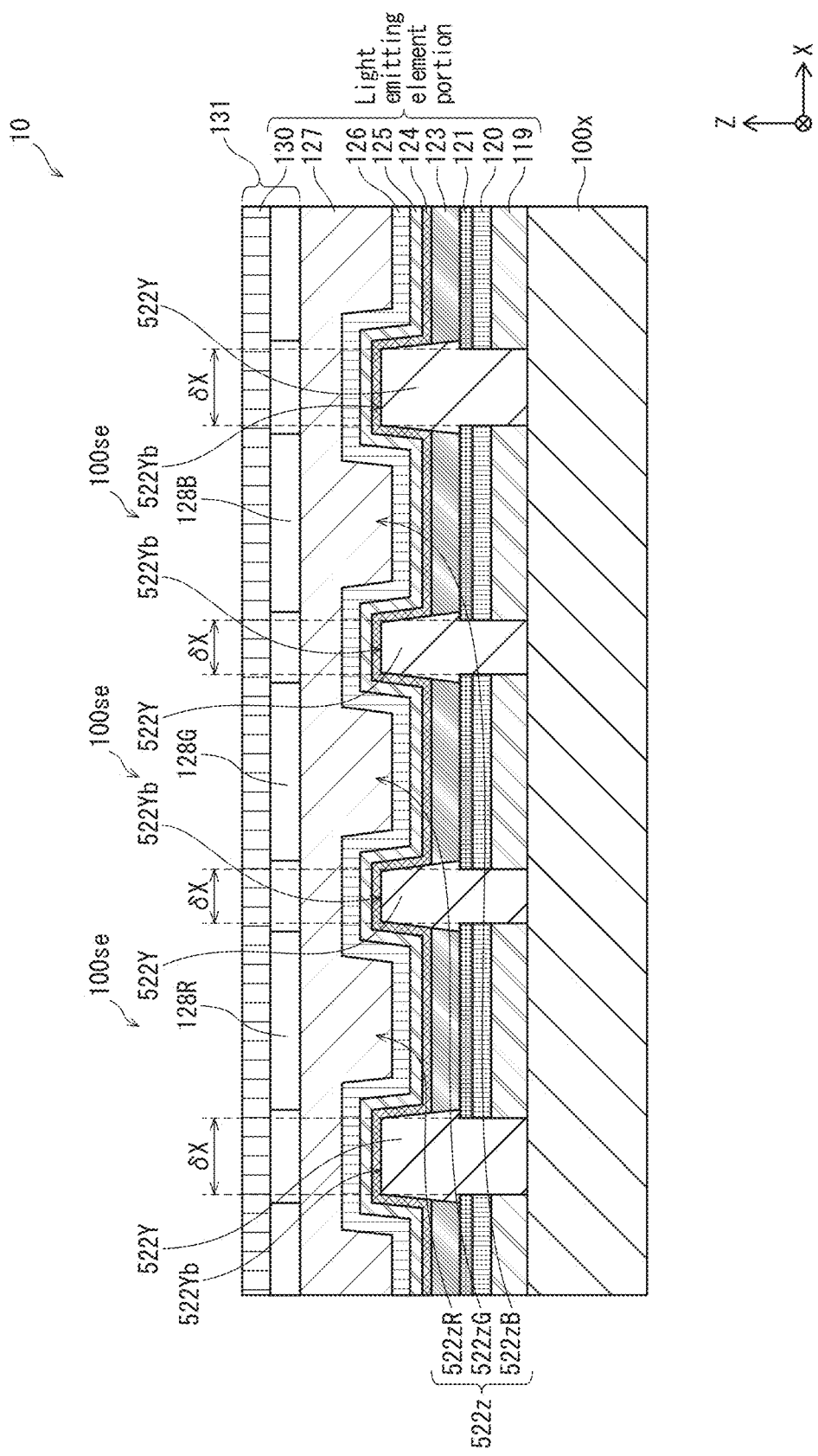
FIG. 4 is a schematic cross section taken along X1-X1 in FIG. 2 according to at least one embodiment.

Configuration of the organic EL display element 100 in the display panel 10 is described with reference to the schematic cross sections of FIG. 3 and FIG. 4. FIG. 3 is a schematic cross section taken along Y1-Y1 in FIG. 2 according to at least one embodiment. FIG. 4 is a schematic cross section taken along X1-X1 in FIG. 2 according to at least one embodiment.

The display panel 10 according to at least one embodiment is configured such that the substrate 100x (TFT substrate) on which a thin film transistor is formed is lower in the Z axis direction, above which is an organic EL element portion.

[Substrate 100x (TFT Substrate)]

The substrate 100x is a support member of the display panel 10, and has a base (not illustrated), a TFT layer (not illustrated) on the base material, and an interlayer insulating layer (not illustrated) on the TFT layer and the base material.

The base is a support member of the display panel 10, and is a flat plate. As a material of the base, an electrically insulating material can be used, such as a glass material, a resin material, a semiconductor material, or a metal material coated with an insulating layer. As examples, a glass substrate, a silica glass substrate, a silicon substrate, a metal substrate of a metal such as molybdenum sulfide, copper, zinc, aluminum, stainless steel, magnesium, iron, nickel, gold, or silver, a semiconductor substrate such as gallium arsenide, a plastic substrate, or similar.

The TFT layer includes TFTs and wires formed on an upper layer of the base A TFT, in accordance with a drive signal from an external circuit of the display panel 10, electrically connects one of the pixel electrodes 119 to an external power source, and is a multilayer structure including layers such as an electrode, a semiconductor layer, and an insulating layer. The wires electrically connect the TFTs, the pixel electrodes 119, the external power source, external circuits, and the like.

The insulating layer disposed on an upper surface of the substrate 100x planarizes at least the sub pixels 100se on the upper surface of the substrate 100x, which would otherwise be uneven due to the TFT layer. Further, the interlayer insulating layer fills space between the wiring and TFTs and electrically insulates the wiring and TFTs.

For the interlayer insulating layer above the TFTs, silicon oxide ($SiO_2$), silicon nitride (SiN) and silicon oxynitride (SiON), or silicon oxide (SiO) and silicon oxynitride (SiON) can be used, for example. As a connecting electrode layer of a TFT, a layered body of molybdenum (Mo), copper (Cu), and copper manganese (CuMn) can be used, for example. The interlayer insulating layer disposed on an upper surface of the substrate 100x is formed by using an organic compound such as polyimide resin, acrylic resin, siloxane resin, novalac-type phenolic resin, or the like. Film thickness of the interlayer insulating layer can be in the range from 2000 nm to 8000 nm.

[Pixel Electrodes 119]

On the interlayer insulating layer disposed on the upper surface of the substrate 100x, the pixel electrodes 119 are provided in units of the sub pixels 100se. The pixel electrodes 119 supply carriers to the light emitting layers 123, for example if the pixel electrodes function as anodes, they supply holes to the light emitting layers 123. Each of the pixel electrodes 119 is a rectangular flat plate shape, and the pixel electrodes 119 are disposed on the substrate 100x with an interval δX between them in the row direction and in the gaps 522z with an interval δY between them in the column direction. Further, for each of the pixel electrodes 119, the connecting recess 119c that is recessed in the direction of the substrate 100x is connected to a source of a TFT via a contact hole provided to an upper surface of the substrate 100x.

The pixel electrodes 119 include a metal material. In the case of top-emission, chromaticity of emitted light is adjusted by adoption of an optical resonator structure for which film thickness is optimally set to increase luminance, and therefore a surface portion of the pixel electrodes 119 has a high reflectivity. The pixel electrodes 119 may have a structure in which a plurality of films selected from a metal layer, an alloy layer, and a transparent conductive layer are layered. The metal layer can include a metal material including silver (Ag) or aluminum (Al). The alloy layer can be made using a silver, palladium, and copper alloy (APC), a silver, rubidium, gold alloy (ARA), a molybdenum chromium alloy (MoCr), a nickel chromium alloy (NiCr), or the like. The transparent conductive layer can be made using indium tin oxide (ITO), indium zinc oxide (IZO), or the like.

[Hole Injection Layers 120, Hole Transport Layers 121]

The hole injection layers 120 and the hole transport layers 121 are layered in this order on the pixel electrodes 119, each of the hole transport layers 121 being in contact with one of the hole injection layers 120. The hole injection layers 120 and the hole transport layers 121 have a function of transporting holes injected from the pixel electrodes 119 to the light emitting layers 123.

Each of the hole injection layers 120 is a layer includes an oxide such as silver (Ag), molybdenum (Mo), chromium (Cr), vanadium (V), tungsten (W), nickel (Ni), iridium (Ir), or the like, or an electrically conductive polymer material such as poly(3,4-ethylenedioxythiophene) polystyrene sulfonate (PEDOT:PSS) or the like.

The hole transport layers 121 can be made using a polymer compound such as polyfluorene, a derivative thereof, polyarylamine, a derivative thereof, or the like.

[Banks 122]

The banks 122 are made of an insulator and are formed to cover edges of the pixel electrodes 119, the hole injection layers 120, and the hole transport layers 121. The banks 122 include the column banks 522Y extending in the column direction and arranged along the row direction and the row banks 122X extending in the row direction and arranged along the column direction. In FIG. 2, the column banks 522Y intersect the row banks 122X, forming a lattice shape (hereinafter, the row banks 122X and the column banks 522Y are collectively referred to as "banks 122" in some instances). Further, an upper surface 522Yb of the column banks 522Y is positioned higher than an upper surface 122M) of the row banks 122X.

The row banks 122X each have a line-like shape extending in the row direction, and in cross section taken along the column direction have a tapered trapezoidal shape tapering upwards. The row banks 122X extend in the row direction, perpendicular to the column direction, passing through the column banks 522Y. Thus, the row banks 122X and the column banks 522Y form openings corresponding to the auto light emitting regions 100a.

The row banks 122X are for controlling flow in the column direction of ink containing an organic compound that is a material of the light emitting layers 123. Thus, the row banks 122X have lyophilicity with respect to the ink that is not less than a predefined value. According to this configuration, fluidity of the ink in the column direction is increased to suppress variation of applied ink amount between sub pixels. The pixel electrodes 119 are not exposed by the row banks 122X and regions in which the row banks 122X are present do not emit light and do not contribute to luminance.

When an upper limit of film thickness of the row banks 122X is thicker than 2000 nm, wet spreading of the ink is poor, and when 1200 nm or less, wet spreading of the ink is further improved. Further, when a lower limit of film thickness is at least 100 nm, end portions of the pixel electrodes 119 are covered by the banks 122, and the pixel electrodes 119 and a counter electrode 125 can be manufactured at a constant yield without short-circuits. When the lower limit of film thickness is at least 200 nm, short defects are reduced making stable manufacturing possible. In a case in which connecting groove portions are provided in the banks 122, the same applied to film thickness at a bottom of the groove portions.

Accordingly, in at least one embodiment, thickness of the row banks 122X ranges from 100 nm to 2000 nm. In at least one embodiment, thickness of the row banks 122X ranges from 200 nm to 1200 nm. According to at least one embodiment, thickness of the row banks 122X is approximately 1000 nm.

The column banks 522Y block flow of the ink in the row direction to define row direction outer edges of the light emitting layers 123. The column banks 522Y each have a line-like shape extending in the column direction, and in cross section taken along the row direction have a tapered trapezoidal shape tapering upwards.

The column banks 522Y define outer edges in the row direction of the light emitting region 100a of each of the sub pixels 100se. Thus, the column banks 522Y require liquid repellency with respect to the ink that is not less than a predefined value.

Accordingly, in at least one embodiment, the thickness of the column banks 522Y ranges from 100 nm to 5000 nm. In at least one embodiment, the thickness of the column banks 522Y range from 200 nm to 3000 nm. According to at least one embodiment, the thickness of the column banks 522Y is approximately 2000 nm.

In order to help prevent current leakage in the thickness direction (Z direction) between outer edges of the pixel electrodes 119 and the counter electrode 125, the banks 122 have an insulation property with a volume resistivity of $1 \times 10^6$ Ωcm or more. Thus, as described later, the banks 122 are configured to be made of a predefined insulating material.

The banks 122 are formed by using an organic material such as a resin, and have an insulation property. As examples of organic material used in forming the banks 122, acrylic resin, polyimide resin, novolac-type phenolic resin, and the like may be used. In at least one embodiment, the banks 122 have organic solvent resistance. In at least one embodiment, the banks 122 include acrylic resin, for a low refractive index, which is suitable for a reflector.

Alternatively, in at least one embodiment, when an inorganic material is used for the banks 122, the banks 122 include silicon oxide (SiO), for example, when considering refractive index. Alternatively, inorganic material such as silicon nitride (SiN), silicon oxynitride (SiON), or the like can be used.

As stated above, in at least one embodiment, the banks 122X have a film thickness of approximately 1000 nm. However, film thickness is not limited to this example and can be in a range from 100 nm to 2000 nm, for example. Further, in at least one embodiment, the banks 522Y have a film thickness of approximately 2000 nm. However, film thickness is not limited to this example and can be in a range from 100 nm to 5000 nm, for example.

Further, the banks 122 are subjected to etching processing, baking processing, and the like during the manufacturing process, and include a highly resistant material that does not excessively deform alter due to such processing in at least one embodiment.

In order to make a surface liquid repellant, the surface can be treated with fluorine. Alternatively, a material containing fluorine may be used in forming the column banks 522Y. In order to lower liquid repellency of a surface of the column banks 522Y, ultraviolet irradiation may be performed on the column banks 522Y, and baking may be performed at a low temperature.

[Light Emitting Layer 123]

The display panel 10 has a structure in which a large number of the column banks 522Y and the gaps 522z alternate with each other. In the gaps 522z, which are defined by the column banks 522Y, the light emitting layers 123 are formed extending in the column direction. In red gaps 522zR corresponding to auto light emitting regions 100aR, green gaps 522zG corresponding to auto light emitting regions 100aG, and blue gaps 522zR corresponding to auto light emitting regions 100aB, light emitting layers 123 that emit corresponding colors of light are formed.

Each of the light emitting layers 123 is a layer including an organic compound, and has a function of emitting light via internal recombination of holes and electrons.

Only portions of the light emitting layers 123 that are supplied carriers from the pixel electrodes 119 emit light, and therefore in regions in which the row banks 122X intervene, the row banks 122X being insulators, electroluminescence of the organic compound does not occur. Thus, only portions of the light emitting layers 123 where the row banks 122X are not present emit light, such portions correspond to the auto light emitting regions 100a, and outer edges of each of the auto light emitting regions 100a in the column direction are defined by column-direction outer edges of the row banks 122X.

Portions of the light emitting layers 123 above side surfaces and upper surfaces 122Xb of the row banks 122X, including the contact regions 119b, do not emit light, and such portions correspond to the non-auto light emitting regions 100b. The light emitting layers 123 are disposed on an upper surface of the hole transport layers 121 in the auto light emitting regions 100a, and are disposed on upper and side surfaces of the row banks 122X in the non-auto light emitting regions 100b.

In FIG. 3, the light emitting layers 123 extend continuously not only in the auto light emitting regions 100a but also across adjacent ones of the non-auto light emitting regions 100b. In this way, when forming the light emitting layers 123, ink applied to the auto light emitting regions 100a can flow in the column direction via ink applied to the non-auto light emitting regions 100b, making equalizing of film thickness between pixels in the column direction possible. However, in the non-auto light emitting regions 100b, ink flow is suppressed to an appropriate extent by the row banks 122X. Accordingly, large amounts of unevenness in film thickness in the column direction is unlikely to occur, and luminance nonuniformity between pixels is reduced.

As a material used for forming the light emitting layers 123, a light emitting organic material that can be made into a film by a wet printing method is used.

More specifically, as described in JPH5-163488, for example, the light emitting layers 123 are include a fluorescent substance such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, or rare earth metal complex.

[Electron Transport Layer 124]

In openings defined by the row banks 122X and the column banks 522Y, the electron transport layer 124 is formed on the light emitting layers 123. Further, according to at least one example, the electron transport layer 124 is also disposed on the upper surfaces 522Yb of the column banks 522Y that are not covered by the light emitting layers 123. The electron transport layer 124 has a function of transporting electrons injected from the counter electrode 125 to the light emitting layers 123. The electron transport layer 124 includes, for example, an oxadiazole derivative (OXD), a triazole derivative (TAZ), a phenanthroline derivative (BCP, Bphen), or the like.

[Counter Electrode 125]

The counter electrode 125 is formed covering the electron transport layer 124. The counter electrode 125 is formed to be continuous across the display panel 10, and may be connected to bus bar wiring (not illustrated) for each pixel or each unit of a number of pixels. The counter electrode 125 forms a conduction path paired with the pixel electron layers 119, sandwiching the light emitting layers 123. The counter electrode 125 supplies carriers to the light emitting layers 123, for example in the case of the counter electrode 125 functioning as a cathode, the counter electrode 125 supplies electrons to the light emitting layers 123. The counter electrode 125 is formed following a surface of the electron transport layer 124, and forms an electrode common to all the light emitting layers 123. The counter electrode 125 is made of an electrically conductive light transmissive material. For example, indium tin oxide (ITO), indium zinc oxide (IZO), or the like can be used. Alternatively, an electrode of thin film silver (Ag), aluminum (Al), or the like may be used.

(8) Sealing Layer 126

The sealing layer 126 is formed covering the counter electrode 125. The sealing layer 126 is for suppressing deterioration of the light emitting layers 123 due to contact with moisture, air, and the like. The sealing layer 126 is provided covering an upper surface of the counter electrode 125, across the display panel 10. The sealing layer 126 can be formed using a light-transmissive material such as silicon nitride (SiN), silicon oxynitride (SiON), or the like. Further, in addition to a layer includes a material such as silicon nitride (SiN), silicon oxynitride (SiON), or the like, a sealing resin layer may be provided, the sealing resin layer includes a resin material such as acrylic resin, silicone resin, or the like.

[Joining Layer 127]

Above the sealing layer 126 in the Z axis direction is a color filter (CF) substrate 131. The CF substrate includes an upper substrate 130 and, on a lower side surface of the upper substrate in the Z axis direction, a color filter layer 128. The CF substrate 131 is joined to the sealing layer 126 by a joining layer 127. The joining layer 127 has a function of joining a "back panel" formed by each layer from the substrate 100x to the sealing layer 126 to the CF substrate 131, and has a function of preventing each layer from being exposed to moisture or air. The joining layer 127 can be made of a light transmissive resin material such as acrylic resin, silicone resin, epoxy resin, or the like.

[Upper Substrate 130]

The CF substrate 131, which includes the upper substrate 130 and the color filter layer 128, is disposed above and joined to the joining layer 127. The display panel 10 is a top-emission type of panel, and therefore the upper substrate 130 can include a light transmissive material such as cover glass, light transmissive resin film, or the like. Further, the upper substrate 130 can improve rigidity of the display panel 10, and help prevent intrusion of moisture, air, and the like. As a light transmissive material, a glass substrate, a silica glass substrate, a plastic substrate, or the like can be used.

[Color Filter Layer 128]

The color filter layer 128 is formed on the upper substrate at positions corresponding to the auto light emitting regions 100a of pixels. The color filter layer 128 is a light transmissive layer provided for allowing transmission of visible light of wavelengths corresponding to R, G, and B and has a function of transmitting light emitted from each color pixel and correcting chromaticity of the transmitted light. For example, according to at least one embodiment, red, blue, and green color filter layers 128R, 128G, and 128B are formed above the auto light emitting regions 100aR in the red gaps 522zR, the auto light emitting regions 100aG in the green gaps 522zG, and the auto light emitting regions 100aB in the blue gaps 522zB, respectively. The color filter layer 128, more specifically, is formed by application of ink to the upper substrate 130, which is cover glass formed with a matrix of openings that correspond to pixels, the ink containing color filter material and solvent.

<Ink Drying Device>
[Overall Configuration]

The following describes configuration of an ink drying device used in the method of manufacturing the display panel 10. FIG. 5 is a schematic cross section of an ink drying device 900 used in the method of manufacturing the organic EL display panel 10 according to at least one embodiment.

The ink drying device 900 is a device for manufacturing the light emitting layers 123, in an ink drying process described later, by a drying and baking process applied to ink containing organic light emitting material under reduced pressure, the ink filling the gaps 522z between the column banks 522Y on the substrate 100x.

In FIG. 5, the ink drying device 900 includes a chamber 500 that accommodates the substrate 100x with ink containing organic light emitting material applied in the gaps 522z between the column banks 522Y, and a support base 700 on which the substrate 100x is placed in the chamber 500. The ink drying device 900 further includes a rectifying plate 400 arranged opposite the substrate 100x, separated from the column banks 522Y by a predefined distance, and an elevation unit 800 that holds the rectifying plate 400 at the predefined distance from the column banks 522Y opposite the substrate 100x and also raises or lowers the rectifying plate 400 and/or the substrate 100x thereby to vary a height of the rectifying plate 400 relative to the substrate 100x. The ink drying device 900 further includes a vacuum pump 600 that is connected to the chamber 500 and sucks gas from the chamber 500 to exhaust the gas out of the chamber 500, and a heater (not illustrated) that heats the substrate 100x on the support base 700. The heater can be a hotplate disposed on the support base 700, and can be an oven that heats the interior of the chamber 500.

The support base 700 is made of a very heat resistance metal or ceramic. The support base 700 is movable in both directions in an out of the chamber 500 via a conveyance unit (not illustrated).

The rectifying plate 400 includes a ceramic or a metal having solvent resistance, such as stainless steel, aluminum, copper, iron, or the like.

Figure 6A:
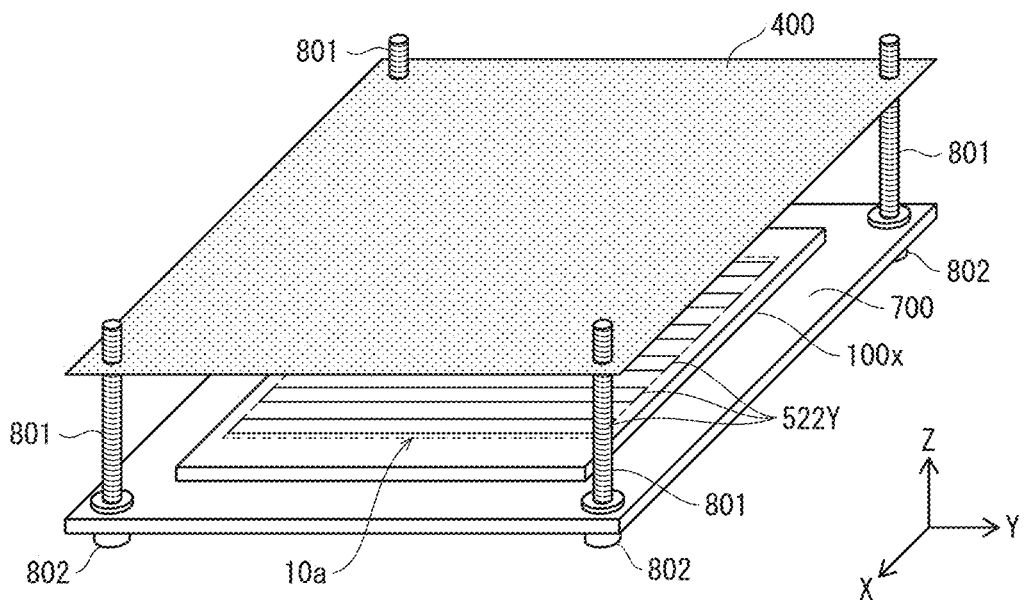
FIG. 6A and FIG. 6B are schematic views of positions of a rectifying plate 400 and a substrate 100x relative to each other in the ink drying device 900 according to at least one embodiment, where
Figure 6B:
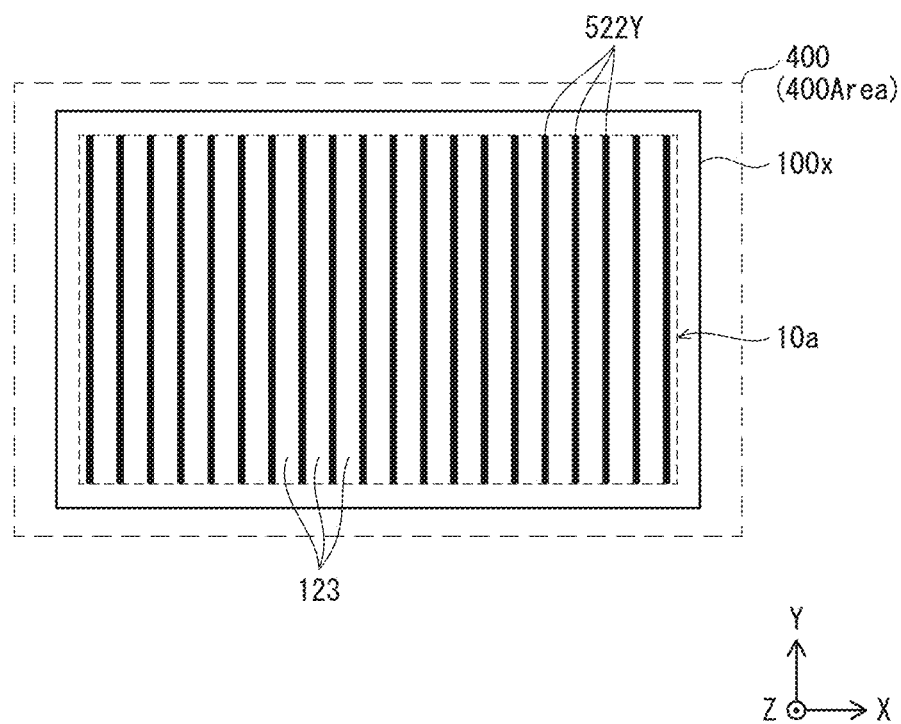

FIG. 6A and FIG. 6B are schematic views of positions of the rectifying plate 400 and the substrate 100x relative to each other in the ink drying device 900 according to at least one embodiment, specifically, FIG. 6A is a perspective view, and FIG. 6B is a plan view of the substrate 100x shown through the rectifying plate 400. In FIG. 6A, and FIG. 6B, the rectifying plate 400 is at least larger than the partitioned region 10a of the substrate 100x in the X direction and the Y direction. In a state in which the rectifying plate 400 is disposed opposite the substrate 100x, a region 400a Area which is covered with the rectifying plate 400 at least includes the partitioned region 10a of the substrate 100x. For example, in FIG. 6B, the substrate 100x may be included in the region 400a Area.

The rectifying plate 400 is configured to be movable in both directions along the Z axis above the support base 700 via the elevation unit 800. The elevation unit 800 includes gap adjustment units 801 which are embodied by ball screws or the like, drive units 802 which are embodied by motors or the like, and a control unit 803. The gap adjustment units 801 hold the rectifying plate 400 and thereby regulate a gap between the support base 700 and the rectifying plate 400. Also, the gap adjustment units 801 are driven by the drive units 802 in accordance with an electrical signal output from the control unit 803 and thereby raise or lower the rectifying plate 400.

Figure 7A:
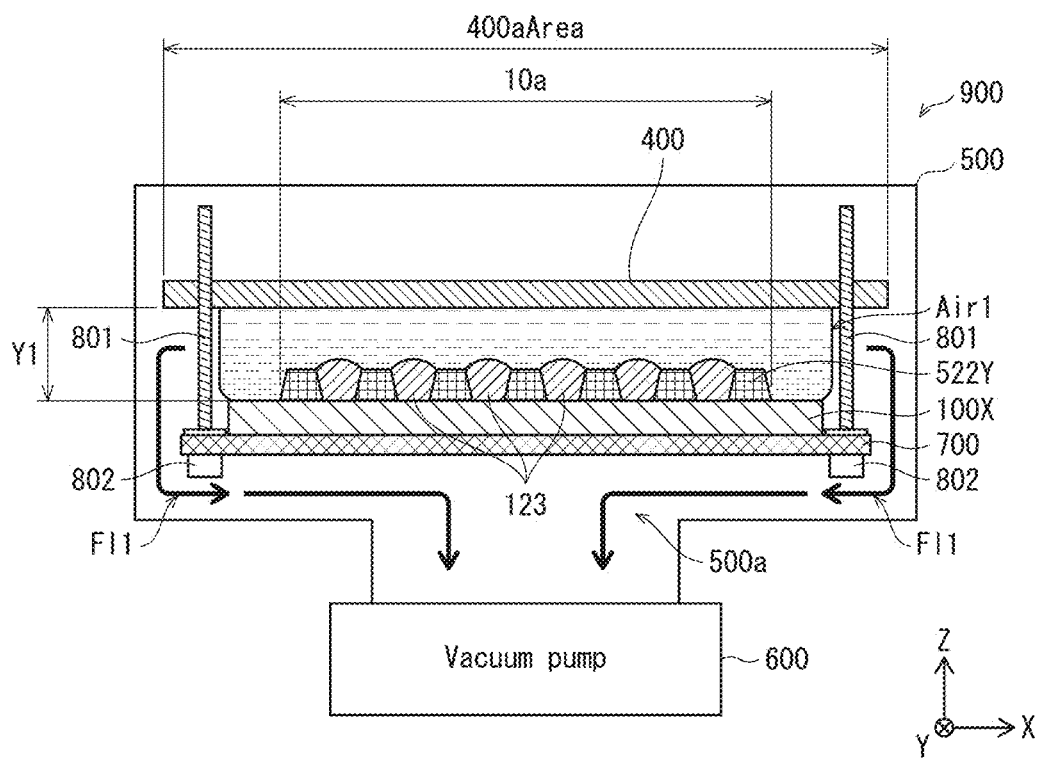
FIG. 7A and FIG. 7B are schematic cross sections showing operations of an elevation unit 800 in the ink drying device 900 according to at least one embodiment.
Figure 7B:
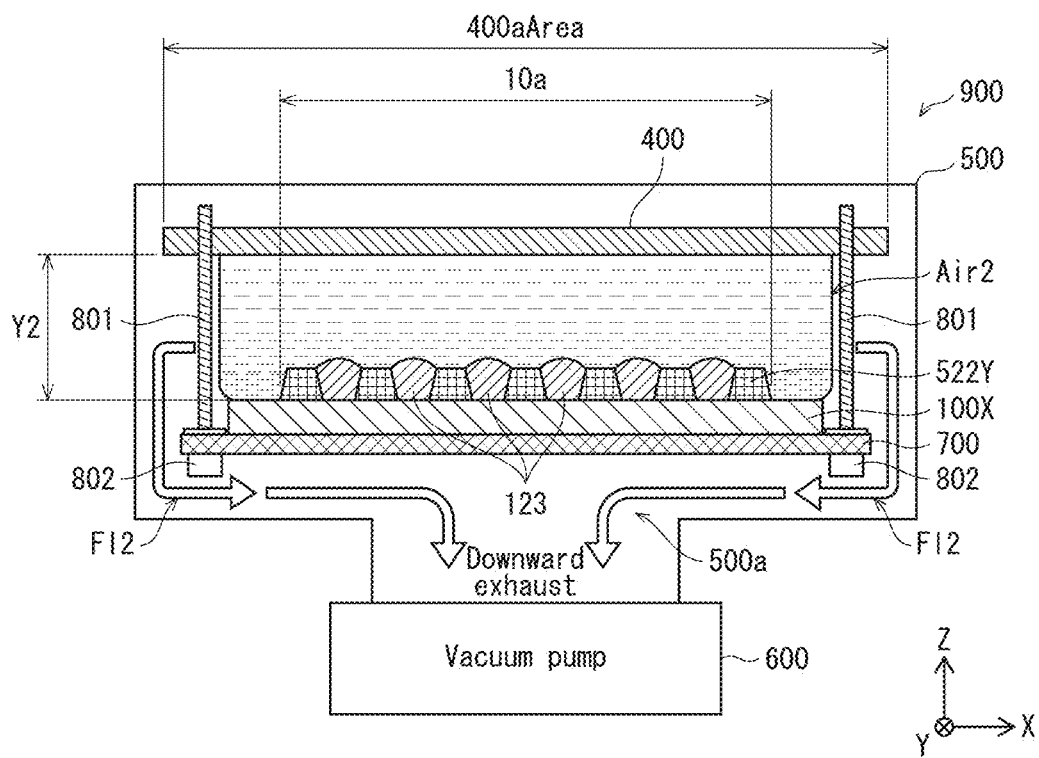

FIG. 7A and FIG. 7B are schematic cross sections showing operations of the elevation unit 800 in the ink drying device 900 according to at least one embodiment. In a state in which the rectifying plate 400 is arranged opposite the substrate 100x, when the rectifying plate 400 and the substrate 100x are close to each other, in at least one embodiment, a first distance Y1 between the rectifying plate 400 and the upper surface of the substrate 100x ranges from 2 mm to 10 mm. Also, when the rectifying plate 400 and the substrate 100x are distant from each other, in at least one embodiment, a second distance Y2 between the rectifying plate 400 and the upper surface of the substrate 100x ranges from 30 mm to 70 mm.

In at least one embodiment, an opening 500a to an exhaust path to the vacuum pump 600 in the chamber 500 is located below the support base 700. In FIG. 5, a gas current can be formed that wraps around the support base 700 and the rectifying plate 400, and vapor Air1 can be exhausted laterally through the rectifying plate 400 in a partitioned region 10a in which the column banks 522Y and the row banks 122X are disposed, which regulate light emitting units in the colors R, G, and B.

In an ink drying process using the ink drying device 900, described below, film shape of the light emitting layers 123 to be formed become uniform in both a peripheral portion and a central portion of a film forming area. That is, suppressing film thickness variation caused by imbalance in solvent evaporation rate due to uneven vapor concentration distribution of ink solvent in central and peripheral portions of a substrate is possible. Also, as described later, when applying ink containing organic light emitting material in column shaped application regions on a substrate, alleviating causes of film thickness variation is possible, such as influence of ink convection caused by imbalance of ink surface tension in the column shaped application regions, insufficient levelling of ink ejection amounts after ejection, steam flow turbulence in the space between the substrate and the rectifying plate, and variation in cross sectional shape of film caused by decrease in solvent evaporation rate.

As a result, a method of manufacturing the display panel 10 that includes the ink drying process reduces luminance nonuniformity caused by nonuniformity of film thickness of the light emitting layers 123 in peripheral and central portions of the film forming area of the display panel 10.

<Method of Manufacturing the Display Panel 10>

Figure 8:
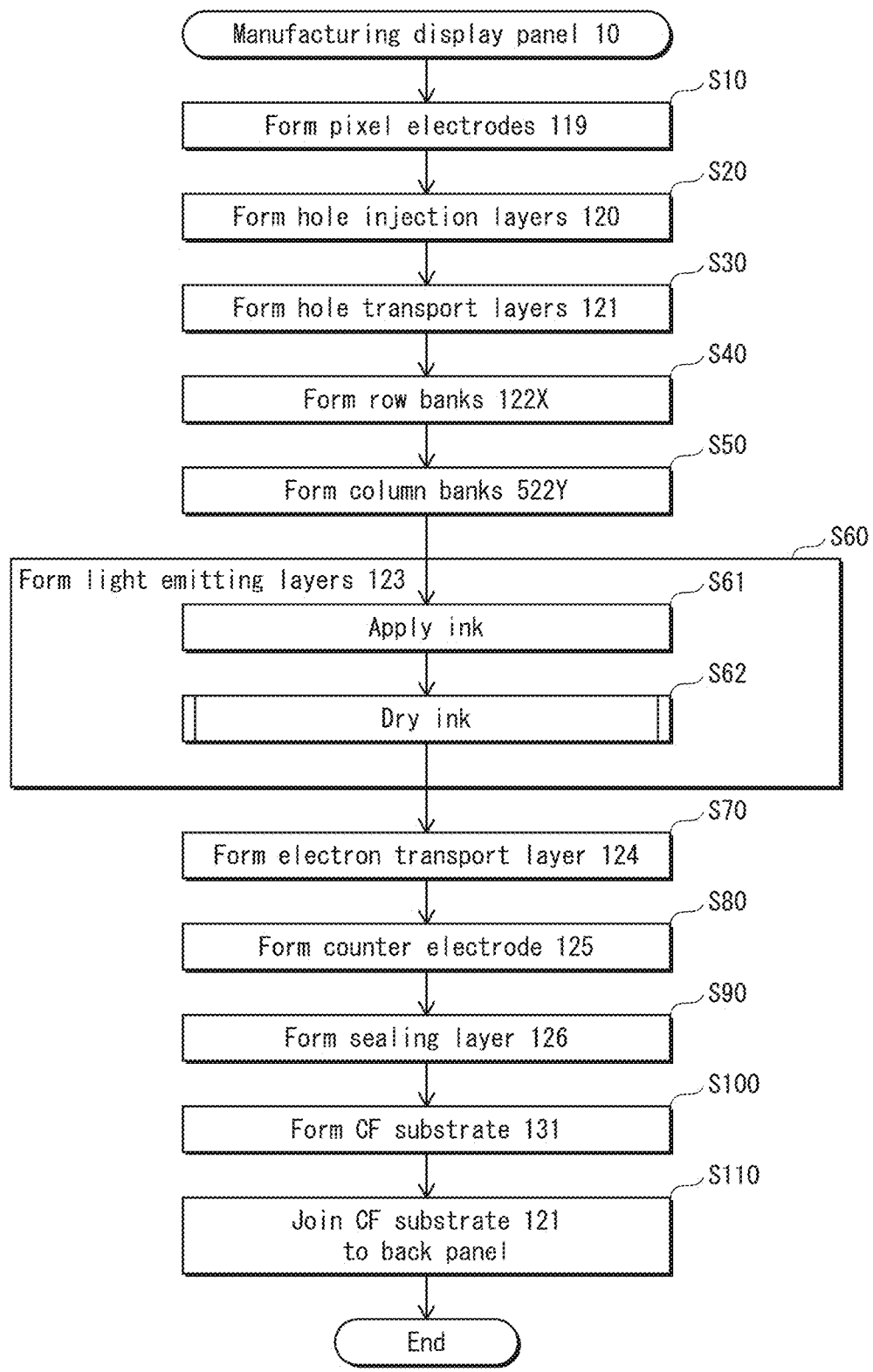
FIG. 8 is a flowchart of a process of manufacturing the organic EL display panel 10 according to at least one embodiment.

The following describes a method of manufacturing the display panel 10. FIG. 8 is a flowchart of a process of manufacturing the display panel 10 according to at least one embodiment. FIG. 9A to FIG. 9D, FIG. 14A, and FIG. 14B are schematic cross sections taken at the same position as Y1-Y1 in FIG. 2, showing states in manufacture of the organic EL display panel 10 according to at least one embodiment.

[Forming the Pixel Electrodes 119]

Figure 9A:
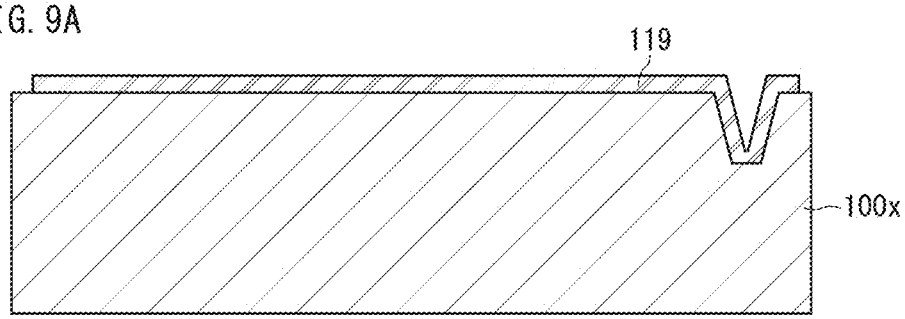
FIG. 9A to FIG. 9D are schematic cross sections taken at the same position as Y1-Y1 in FIG. 2, showing states in manufacture of the organic EL display panel 10 according to at least one embodiment.

Initially, in FIG. 8 and FIG. 9A, the TFT substrate 100x is prepared as far as forming an interlayer insulating layer. Contact holes are formed in the interlayer insulating layer, and the pixel electrodes formed (S10).

The pixel electrodes 119 are formed by forming a metal film by using sputtering, vacuum deposition, or the like, and then patterning the metal film by using photolithography and etching, or the like. The pixel electrodes 119 are electrically connected to TFT electrodes.

[Forming Hole Injection Layers 120 and Hole Transport Layers 121]

Figure 9B:
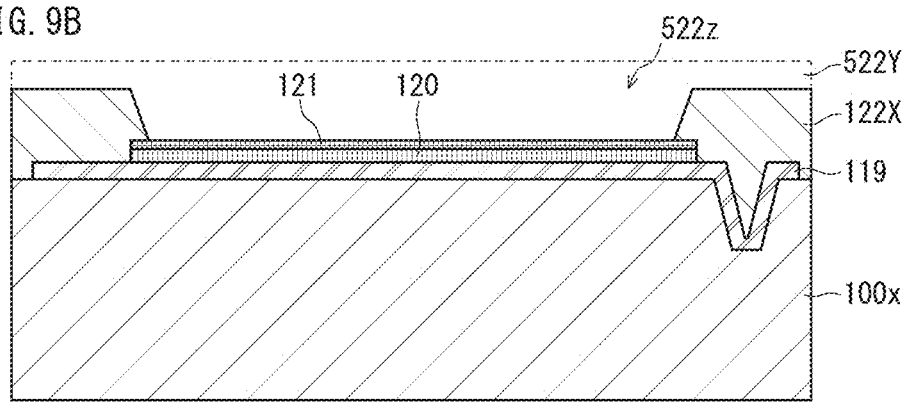

Next, as shown in FIG. 9B, the hole injection layers 120 and the hole transport layers 121 are formed on the pixel electrodes 119 (steps S20, S30). The hole injection layers 120 and the hole transport layers 121 are formed by forming a film made of a metal oxide (for example, tungsten oxide) by using sputtering or depositing a film made of a metal (for example, tungsten) by using sputtering then oxidating the film by firing. Subsequently, patterning of each pixel unit may be performed by using photolithography and etching.

[Forming Banks 122]

In FIG. 9B, the banks 122 are formed covering edges of the hole transport layers 121. In forming the banks 122, initially the row banks 122X are formed (step S40), then the column banks 522Y are formed in order to form the gaps 522z that define pixels (step S50). In the gaps 522z, a surface of each of the hole transport layers 121 is exposed between the row banks 122X.

To form the banks 122, first, a film made of a material of the banks 122 (for example, a photosensitive resin material) is layered on the hole transport layers 121. Then the resin film is patterned to form the row banks 122X and the column banks 522Y in order. Patterning of the row banks 122X and the column banks 522Y is performed by exposure to light of the resin film from above while using a photomask, developing, and firing (at approximately 230° C. for 60 min).

More specifically, initially, when forming the row banks 122X, a photosensitive resin film includes an organic photosensitive resin material such as acrylic resin, polyimide resin, novalac-type phenolic resin, or the like is formed by using a spin coating method or the like. After drying to partially volatize solvent, a photomask provided with predefined openings is overlaid, and ultraviolet light irradiation is performed from above to expose a photoresist made of a photosensitive resin or the like, transferring the pattern of the photomask to the photoresist. Next, the photosensitive resin is developed to form patterned insulating layers of the row banks 122X. Typically, a positive type of photoresist is used. A positive type of photoresist is removed by developing portions exposed to light. Portions of the mask pattern that are not exposed to light are not developed, leaving the row banks 122X having a film thickness of approximately 500 nm.

When forming the column banks 522Y, initially, a spin coating method is used to form a film made of material of the column banks 522Y (for example, a photosensitive resin material). Then the resin film is patterned to form the column banks 522Y and the gaps 522z. The gaps 522z are formed by positioning a mask above the resin layer, performing light exposure, and developing. The column banks 522Y extend in the column direction and alternate in the row direction with the gaps 522z.

The column banks 522Y block flow, in the row direction, of ink containing an organic compound that is a material of the light emitting layers 123, in order to define outer edges of the light emitting layers 123 in the row direction, and therefore the column banks 522Y have liquid repellency with respect to the ink of at least a predefined value. On the other hand, in order for the row banks 122X to control flow of the ink in the column direction, the row banks 122X have lyophilicity with respect to the ink of at least a predefined value.

In order to provide surfaces of the column banks 522Y with liquid repellency, surfaces of the column banks 522Y can be CF4 plasma treated. Alternatively, a material containing fluorine may be used in forming the column banks 522Y, or a composition including a material containing fluorine may be used in forming the column banks 522Y.

[Forming Light Emitting Layers 123]

Figure 9C:
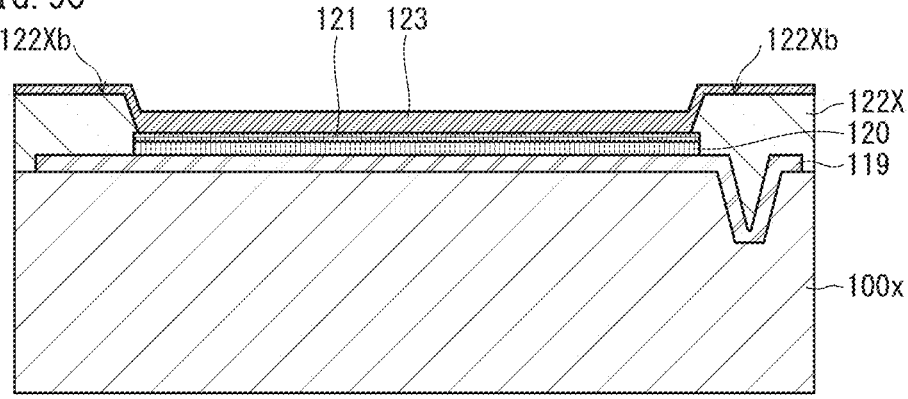

In FIG. 9C, the light emitting layers 123 are layered on the hole transport layers 121 in the gaps 522z defined by the column banks 522Y (step S60).

Forming of the light emitting layers 123 is performed by using an inkjet method to apply ink containing organic light emitting material into the gaps 522z defined by the column banks 522Y (step S61), then drying the ink by baking (step S62).

More specifically, in this process, inks 123RI, 123GI, and 123BI containing R, G, and B organic light emitting layer material, respectively, are applied by an inkjet method to the gaps 522z, which are sub pixel formation regions. The inks are then dried under reduced pressure and baked to form the light emitting layers 123R, 123G, and 123B (FIG. 9C).

(Ink Application Method (Step S60))

In application of ink of the light emitting layers 123, first, a solution for forming the light emitting layers 123 is applied by using a droplet ejecting device. Upon completion of application of ink for forming any one of the red light emitting layers, the green light emitting layers, and the blue light emitting layers on the substrate 100x, another color of ink is applied to the substrate 100x, then the third color of ink is applied to the substrate 100x, and in this way the three colors of ink are applied in sequence. As a result, red light emitting layers, green light emitting layers, and blue light emitting layers alternate across the substrate 100x.

Figure 10:
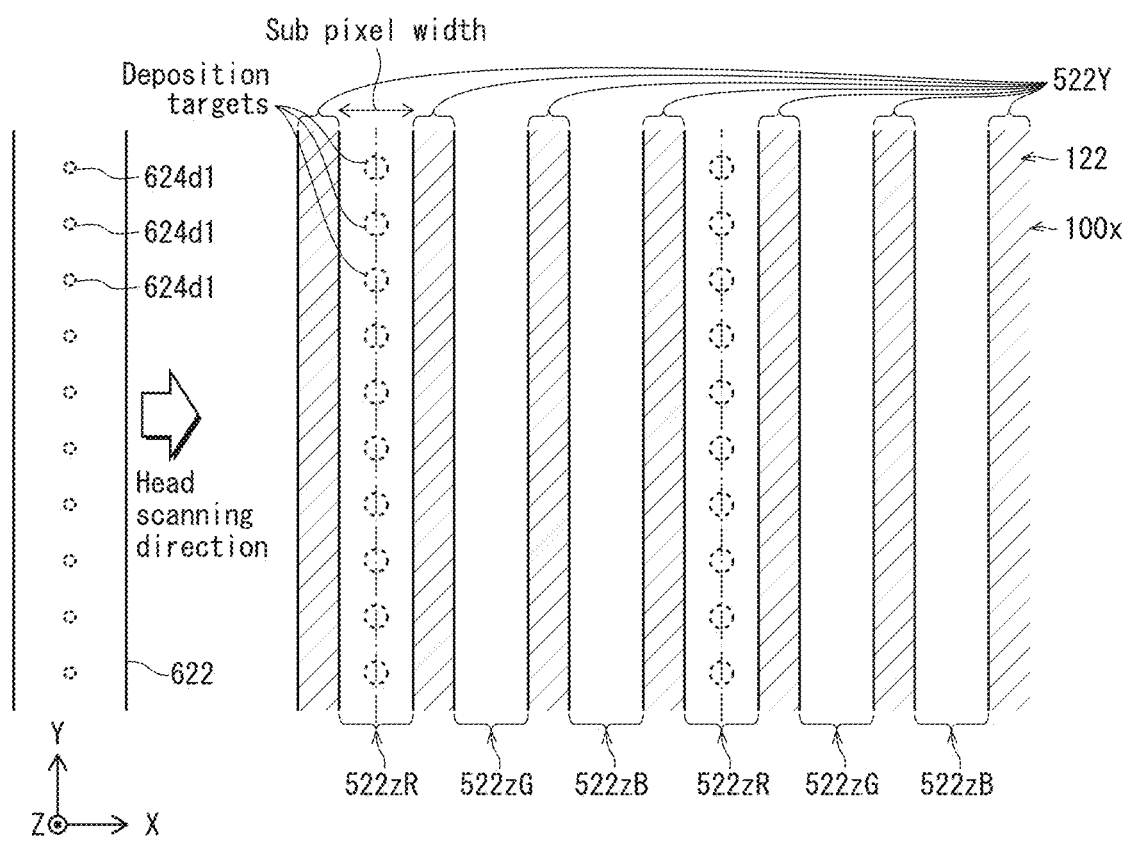
FIG. 10 is a diagram of applying ink for forming light emitting layers on a substrate during manufacture of the organic EL display panel 10, in which the ink is applied to grid-like regions defined by banks 122X and 522Y according to at least one embodiment.

The following describes in detail an inkjet method for applying inks of the light emitting layers 123 into the gaps 522z. FIG. 10 is a schematic diagram showing application of ink for forming light emitting layers on a substrate, in a case of uniformly applying ink to the gaps 522z between the column banks 522Y according to at least one embodiment.

When forming the light emitting layers 123, using inks that are solutions for forming the light emitting layers 123, the light emitting layers 123R in the gaps 522zR for red sub pixels, the light emitting layers 123G in the gaps 522zG for green sub pixels, and the light emitting layers 123B in the gaps 522zB for blue sub pixels are formed in regions between the column banks 522Y. Thicknesses of the light emitting layers 123R, the light emitting layers 123G, and the light emitting layers 123B are different from each other. More specifically, an amount of ink applied into the gaps 522zR is greater than an amount applied to the gaps 522zB and greater than an amount applied to the gaps 522zG, and therefore thickness of the light emitting layers 123R is greater than thickness of the light emitting layers 123B and greater than thickness of the light emitting layers 123G.

In order simplify description, an amount of ink to be ejected from nozzles is set to a first condition, then ink is applied to first color gaps on the substrate, then an amount of ink to be ejected from nozzles is set to a second condition, then ink is applied to second color gaps on the substrate, then an amount of ink to be ejected from nozzles is set to a third condition, then ink is applied to third color gaps on the substrate, and by this method ink is sequentially applied to all three colors of gaps. When application of ink to the first color gaps on the substrate is finished, ink is applied to the second color gaps on the substrate, then ink is applied to the third color gaps on the substrate, thereby sequentially applying inks for three colors of gaps.

Alternatively, inks for three colors of gaps may be sequentially applied such that, when application of ink to the first color gaps of a plurality of substrates is finished, ink is applied to the second color gaps of the plurality of substrates, then ink is applied to the third color gaps of the plurality of substrates.

Alternatively, inks for three colors of gaps on a substrate may be applied such that an amount of ink to be ejected from nozzles is set to a first condition, then ink is applied to a first color gap on the substrate, then an amount of ink to be ejected from nozzles is set to a second condition, then ink is applied to an adjacent second color gap on the substrate, then an amount of ink to be ejected from nozzles is set to a third condition, then ink is applied to an adjacent third color gap on the substrate, then an amount of ink is reset to the first condition, then ink is applied to an adjacent first color gap on the substrate, and so on, until ink is applied to all gaps on the substrate.

(Method of Uniformly Applying Ink to Gaps 522z Between Column Banks 522Y)

The following describes a method of applying ink to the gap of one color (for example, ink for a red gap).

The light emitting layers 123 extend continuously not only in the auto light emitting regions 100a but also across adjacent ones of the non-auto light emitting regions 100b. In this way, when forming the light emitting layers 123, ink applied to the auto light emitting regions 100a can flow in the column direction via ink applied to the non-auto light emitting regions 100b, and film thickness can be equalized between pixels in the column direction. However, in the non-auto light emitting regions 100b, ink flow is suppressed to an appropriate extent by the row banks 122X. Accordingly, large amounts of unevenness in film thickness in the column direction is unlikely to occur, luminance uniformity between pixels is improved, and life of pixels is improved.

In at least one embodiment of the present application method, in FIG. 10, the substrate 100x is placed on a work table of a droplet ejecting device in a state in which the column banks 522Y extend along the Y direction, and an inkjet nozzle head 622 in which ejection openings 624d1 are arranged in a line along the Y direction is scanned across the X direction while ink aimed at deposition targets set in the gaps 522z between the column banks 522Y is deposited from the ejection openings 624d1.

For one application amount, regions to which ink of the light emitting layers 123 are applied are one out of every three regions in the X direction.

Methods of forming the light emitting layers 123 are not limited to these examples, and ink may be dropped and applied by a publicly known method other than an inkjet method or gravure printing method, such as a dispenser method, a nozzle coating method, a spin coating method, intaglio printing, letterpress printing, or the like.

(Ink Drying Method (Step S62))

Figure 11:
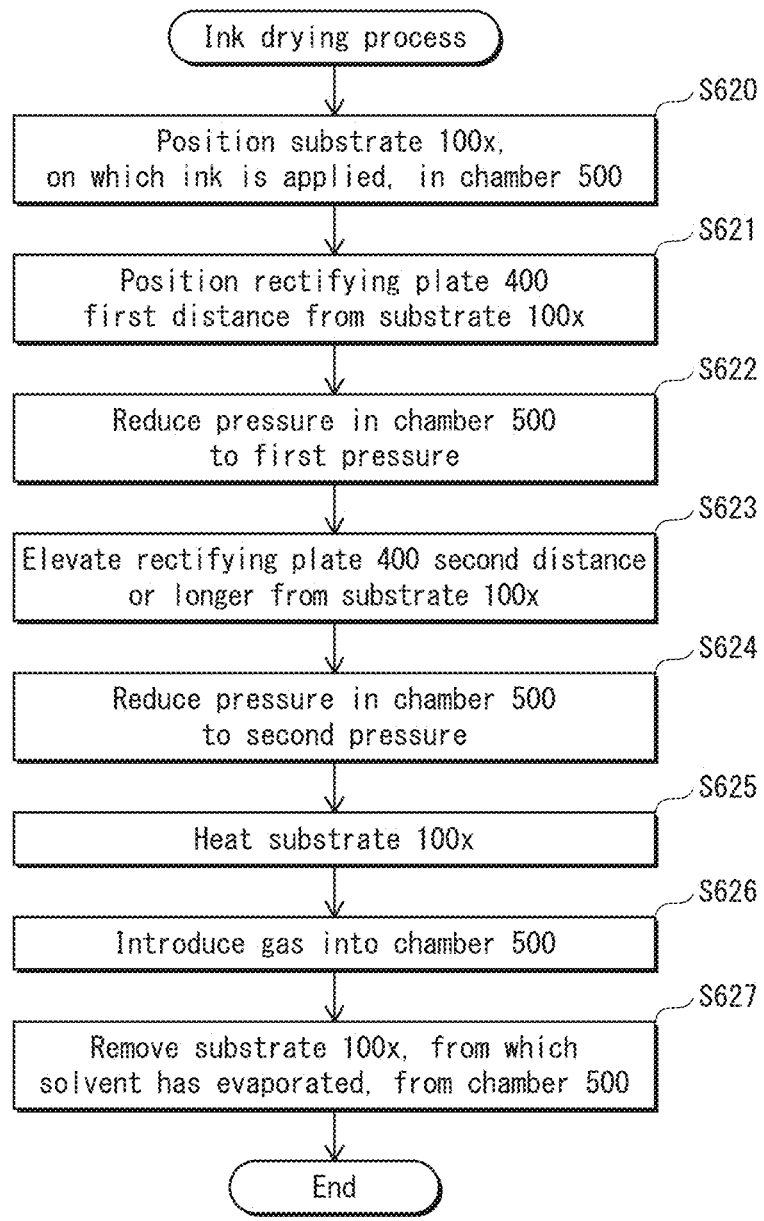
FIG. 11 is a flowchart of a detailed ink drying process in manufacture of the organic EL display panel 10 according to at least one embodiment.

The following describes an ink drying process of drying applied ink by baking. FIG. 11 is a flowchart of a detailed ink drying process in manufacture of the organic EL display panel 10 according to at least one embodiment.

In step S620, the substrate 100x, onto which ink containing organic light emitting material is applied in the gaps 522z between the column banks 522Y, is placed on the support base 700 and the support base 700 is moved into the chamber 500 by the conveyance unit (not illustrated) so that the substrate 100x is inside the chamber 500.

In step S621, the rectifying plate 400 is moved downward from above in the chamber 500 by the elevation unit 800, and the gap between the support base 700 and the rectifying plate 400 is adjusted and thereby the distance between the rectifying plate 400 and the upper surface of the substrate 100x is regulated to the first distance Y1, which is 2 mm to 10 mm. Alternatively, a ratio of the first distance Y1 to a width of a range including the column banks 522Y on the substrate 100x may range from 5/2000 to 5/100. At this time, the rectifying plate 400 is raised or lowered by the drive units 802 driving the gap adjustment units 801, which are provided around the support base 700, in accordance with an electrical signal output from the control unit 803.

Figure 12:
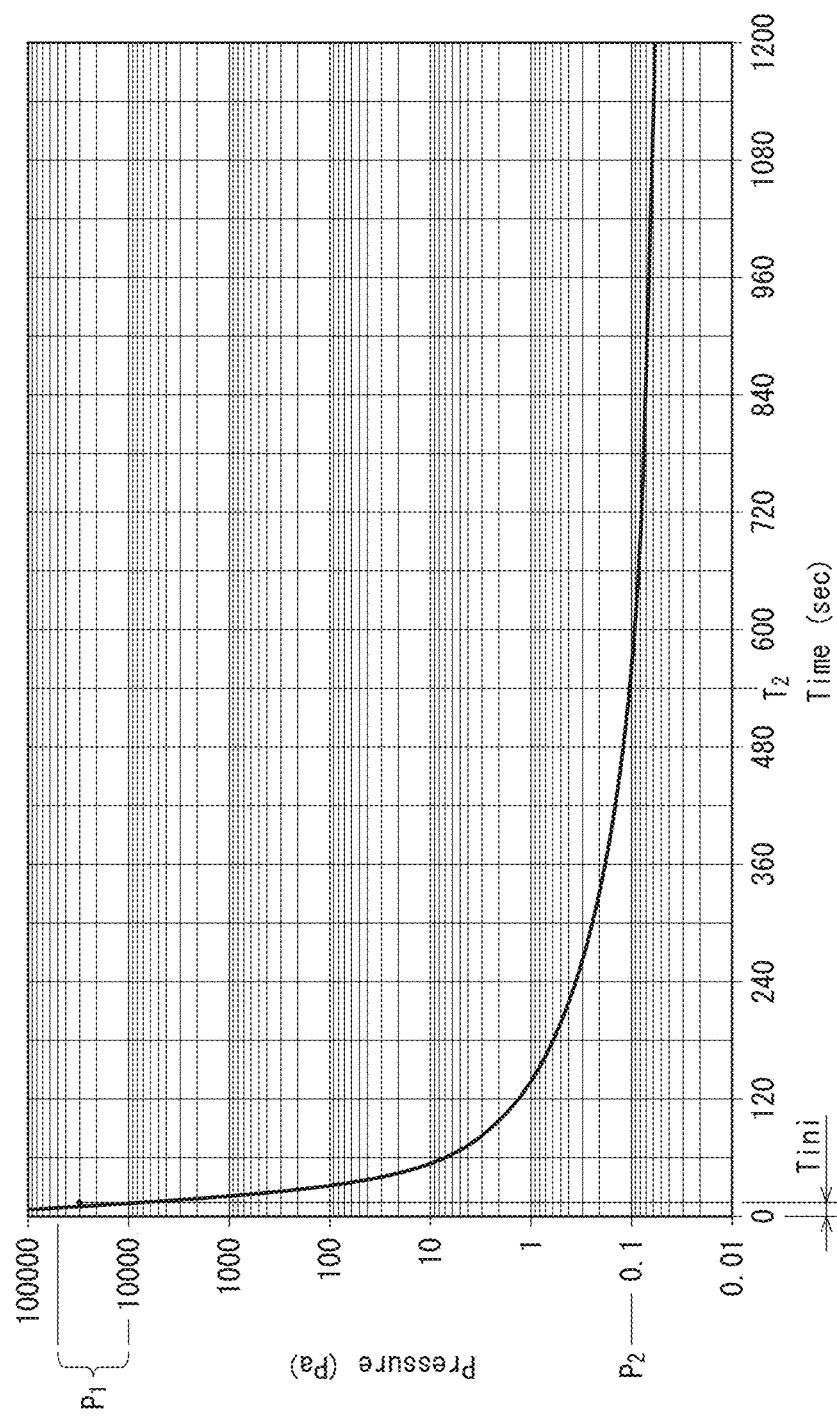
FIG. 12 is a graph of variation over time of pressure in a chamber in the ink drying process according to at least one embodiment.

FIG. 12 is a graph of variation over time of pressure in a chamber in the ink drying process according to at least one embodiment. In FIG. 12, according to at least one embodiment, pressure in the chamber 500 starting from approximately 100 kPa is reduced by $1/10{,}000$ to approximately 10 Pa in approximately 1 min and by $1/100{,}000$ to less than 1 Pa in a time from 2 min to 3 min from the start, and is subsequently reduced to less than 0.1 Pa in a subsequent time after a time point $T_2$.

Next, in step S622, while the distance between the rectifying plate 400 and the upper surface of the substrate 100x is regulated to the first distance Y1, the vacuum pump 600 is driven to reduce the pressure according to a pressure reduction profile in FIG. 12. Specifically, the pressure in the chamber 500 is reduced from atmospheric pressure to a first pressure P1 in a time Tini. The first pressure P1 is $1 \times 10^4$ Pa to $5 \times 10^4$ Pa. In at least one embodiment, the first pressure P1 ranges from $2 \times 10^4$ Pa to $3 \times 10^4$ Pa. The time Tini is for example a time from 1 sec after start of the reduction of the pressure in the chamber 500 to 300 sec at a maximum after the start of the reduction of the pressure.

In this state, in the space between the substrate 100x and the rectifying plate 400, vapor of ink solvent evaporated from the partitioned region 10a of the substrate 100x is suppressed from moving across the substrate 100x. That is, the vapor of the ink solvent evaporated from the partitioned region 10a (vapor Air1 in FIG. 7A) is forced in the space with the height Y1 between the substrate 100x and the rectifying plate 400, and thus vapor pressure in the space increases. Thus, a flow path resistance caused by the substrate 100x and the rectifying plate 400 increases. Then, the solvent vapor Air1 remains in the space between the substrate 100x and the rectifying plate 400, and a minute amount of the solvent vapor is exhausted laterally through the rectifying plate 400 (vapor Fl1 in FIG. 7A). As a result, in a process of reducing the pressure in the chamber 500 to the first pressure, a high vapor concentration of the ink solvent vapor Air1 in an atmosphere of a gap between the rectifying plate 400 and the column banks 522Y on the substrate 100x is maintained, forming a saturated zone of the solvent vapor above the substrate 100x and suppressing evaporation of the ink solvent from the partitioned region 10a of the substrate 100x. Then, movement of the ink in the gaps 522z of the substrate 100x is permitted for the predefined time Tini, and therefore the ink in the gaps 522z

Moves in the column direction to be levelled, reducing the film thickness variation in the predefined time.

After the pressure in the chamber 500 reaches the first pressure P1, in step S623, the rectifying plate 400 is positioned at a second distance Y2 from the upper surface of the substrate 100x. The second distance Y2 is greater than the first distance Y1. In at least one embodiment, the second distance ranges for example from 30 mm to 70 mm.

Then, in step S624, in the state in which the rectifying plate 400 is separated from the upper surface of the substrate 100x by the second distance, which is greater than the first distance, the pressure in the chamber 500 is reduced to a second pressure P2 or lower. The second pressure P2 is lower than the first pressure P1.

In this state, air flow Fl2 is generated from inside the chamber 500 where the support base 700 and the rectifying plate 400 are located to outside the chamber 500 (air flow Fl2 in FIG. 7B). Here, in the space with the height Y2 between the substrate 100x and the rectifying plate 400, the vapor of the ink solvent evaporated from the partitioned region 10a of the substrate 100x is facilitated to move across the substrate 100x. That is, the vapor of the ink solvent evaporated from the partitioned region 10a (vapor Air2 in FIG. 7B) is released in the space with the height Y2 between the substrate 100x and the rectifying plate 400, and thus the vapor pressure in the space decreases. Thus, the flow path resistance caused by the substrate 100x and the rectifying plate 400 decreases. Accordingly, the vapor Air2 of the solvent evaporated from the ink applied to the substrate 100x is sucked by the air flow Fl2 and thus to be exhausted laterally through the rectifying plate 400 from the space between the substrate 100x, and is further exhausted outside the chamber 500 by the air flow Fl2. As a result, in the process of reducing the pressure in the chamber 500 to the second pressure or lower, evaporation of the solvent of the ink is promoted.

In the pressure reduction process in FIG. 12, in primarily a time from 2 min to 3 min from the start, air flow is generated from inside the chamber 500 where the support base 700 and the rectifying plate 400 are located to outside the chamber 500, in FIG. 5. Similarly, vapor of solvent evaporated from ink applied to the substrate 100x is exhausted from the space between the substrate 100x and the rectifying plate 400 to outside the chamber 500 in primarily the time from 2 min to 3 min. from the start.

Next, the pressure in the chamber 500 is reduced until the pressure falls to the second pressure P2, is maintained equal to or less than the second pressure P2, and solvent in applied ink is evaporated as the ink is dried. Subsequently, the light emitting layers 123 are formed by applying a baking treatment to the substrate 100x (step S625). The baking treatment is performed by baking under predefined conditions (vacuum baking at a heating temperature of approximately 150° C. for approximately 60 min).

When baking is complete, gas is introduced into the chamber 500 (step S626), the rectifying plate 400 is moved upward by the elevation unit 800 away from the substrate 100x, the support base 700 is moved outside the chamber 500 by the conveyance unit (not illustrated), transferring the substrate 100x on which the light emitting layers 123 are formed out of the chamber 500 (step S627) and completing the ink drying process.

[Forming the Electron Transport Layer 124, the Counter Electrode 125, and the Sealing Layer 126]

Figure 9D:
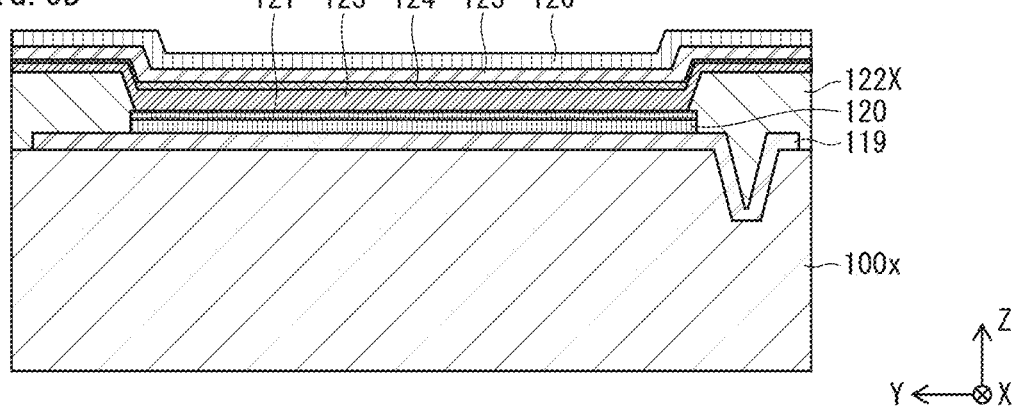

In FIG. 9D, the electron transport layer 124 is formed using vacuum deposition or the like in the gaps 522z and on the column banks 522Y as a solid film (step S70). The counter electrode 125 and the sealing layer 126 are layered in this order covering the electron transport layer 124 as solid films in the gaps 522z and the column banks 522Y (steps S80 and S90). The counter electrode 125 and the sealing layer 126 can be formed by using CVD, sputtering, or the like.

[Forming CF Substrate 131]

Next, the CF substrate 131 is formed (step S100). FIG. 13A to FIG. 13D are schematic cross sections showing states in manufacturing the CF substrate 131 in manufacture of the organic EL display panel 10 according to at least one embodiment.

In forming the CF substrate 131, first, a light transmissive upper substrate 130 is prepared (FIG. 13A). Next, on a surface of the upper substrate 130, material of the color filter layer 128 (for example, G) that has an ultraviolet light curing resin as a primary component is dispersed in a solvent and applied as a paste 128X (FIG. 13B). After removal of a certain amount of solvent, a predefined pattern mask PM2 is placed and ultraviolet light irradiation is performed (FIG. 13C). Subsequently, curing is performed, the pattern mask PM2 and uncured paste 128X are removed and developing is performed to form the color filter layer 128(G) (FIG. 13D). The color filter layer 128(R) and 128(B) is formed by repeating the processes of FIG. 13B to FIG. 13D for color filter material of the respective color. Instead of using the paste 128X, a commercially available color filter product may be used.

[Joining of CF Substrate 131 and Back Panel]

The following describes joining of the CF substrate 131 and the back panel (step S110).

Figure 14A:
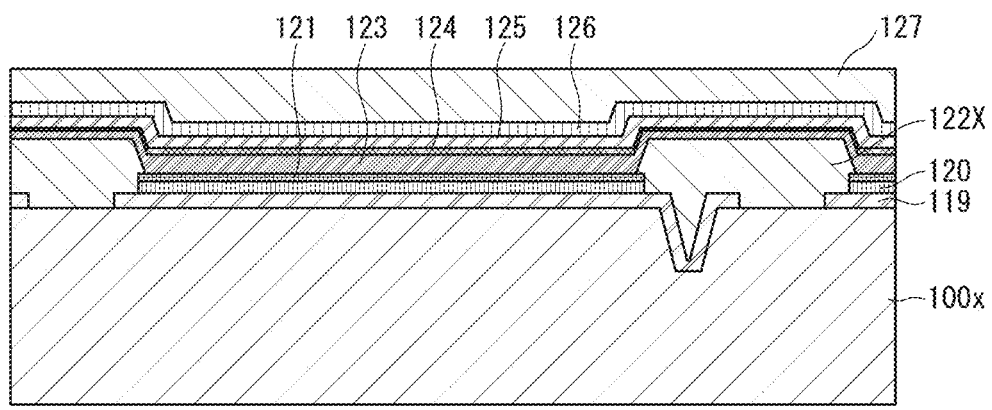
FIG. 14A to FIG. 14B are schematic cross sections taken at the same position as Y1-Y1 in FIG. 2, showing states in which the CF substrate 131 and a back panel are adhered together in manufacture of the organic EL display panel 10 according to at least one embodiment.

In this process, first, material of the joining layer 127, which includes ultraviolet light curing resin such as acrylic resin, silicone resin, epoxy resin, or the like, is applied to the back panel, which comprises every layer from the substrate 100x to the sealing layer 126 (FIG. 14A).

Figure 14B:
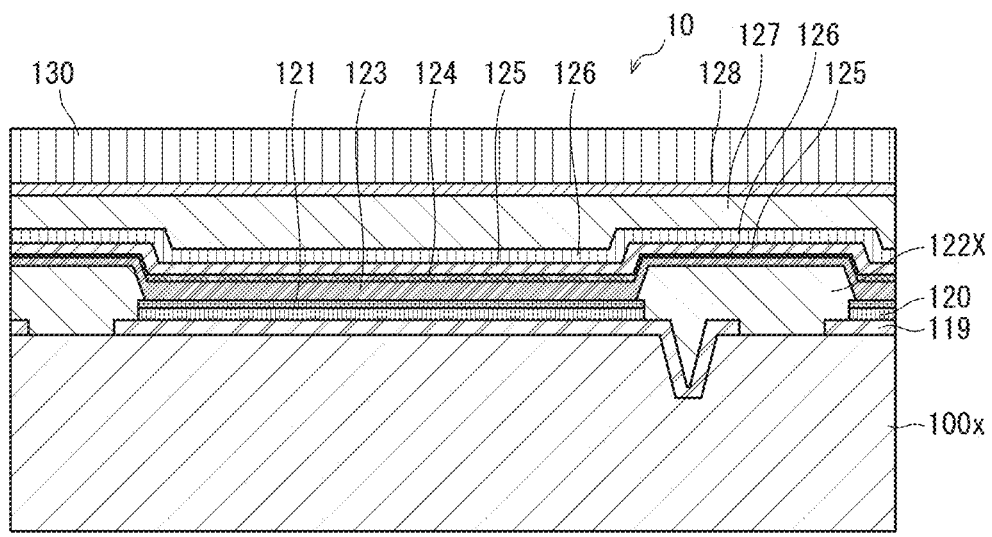

Subsequently, the applied material is irradiated with ultraviolet light, and the back panel and the CF substrate 131 are joined while matching positions relative to each other. At this time, care is taken to avoid gas entering between the back panel and the CF substrate 131. Subsequently, when the back panel and the CF substrate 131 are baked and a sealing process is complete, the display panel 10 is completed (FIG. 14B).

<Effects of the Method of Manufacturing Display Panel 10>

The following describes effects that can be obtained by the method of manufacturing the display panel 10.

[Film Thickness Measurement Results]

Figure 15:
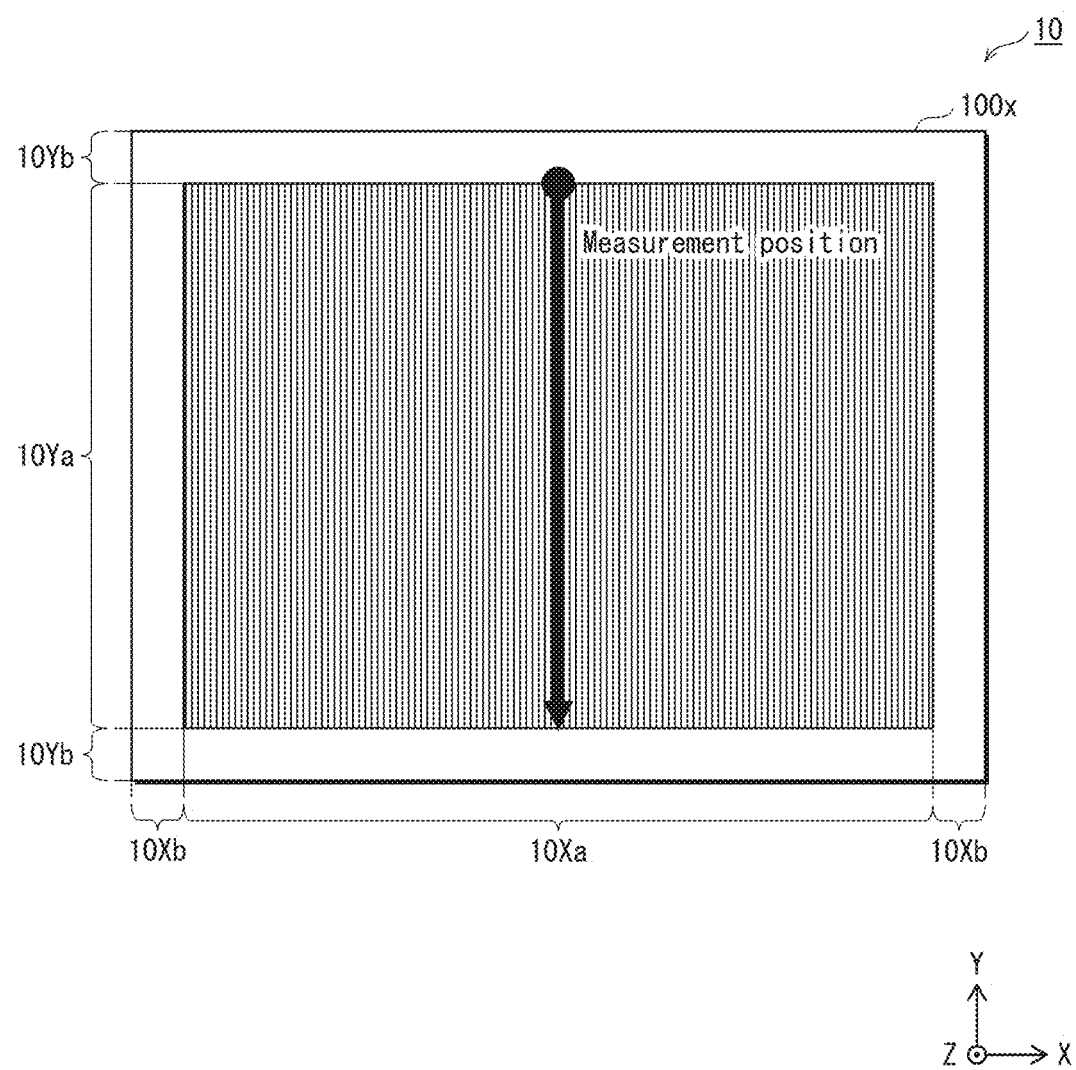
FIG. 15 is a schematic plan view showing film thickness measurement positions in a working example and comparative examples 1 and 2 of the organic EL display panel 10 according to at least one embodiment.

The inventors measured distribution of film thickness of the light emitting layers 123 in the display panel 10. FIG. 15 is a schematic plan view showing film thickness measurement positions in a working example and comparative examples 1 and 2 according to at least one embodiment. In the present experiment, in the working example of the display panel 10, distribution of film thickness of the light emitting layers 123 on the substrate 100x on a center line in the X direction in the partitioned region 10a was measured from a column-direction end 522Ye to a column-direction end 522Ye of the column banks 522Y.

(1) Samples to be Tested

The following describes specifications of the working example and the comparative examples 1 and 2.

The working example is the display panel 10 manufactured by a method using the ink drying device 900 in the ink drying process according at least one embodiment. In the working example, the first pressure was set to $3 \times 10^4$ Pa, the first distance was set to 5 mm, the second distance was set to 50 mm, and the second pressure was set to 1×10⁻¹ Pa.

The comparative example 1 is a display panel manufactured by using an ink drying device in which the distance between the rectifying plate 400 and the upper surface of the substrate 100x is fixed to 50 mm in the ink drying process.

The comparative example 2 is a display panel manufactured by using an ink drying device in which the distance between the rectifying plate 400 and the upper surface of the substrate 110x is fixed to 5 mm in the ink drying process.

Note that the conditions in the comparative examples 1 and 2 are the same as the conditions in the working example, except for the distance between the rectifying plate 400 and the upper surface of the substrate 100x.

(2) Measurement Results

Figure 16:
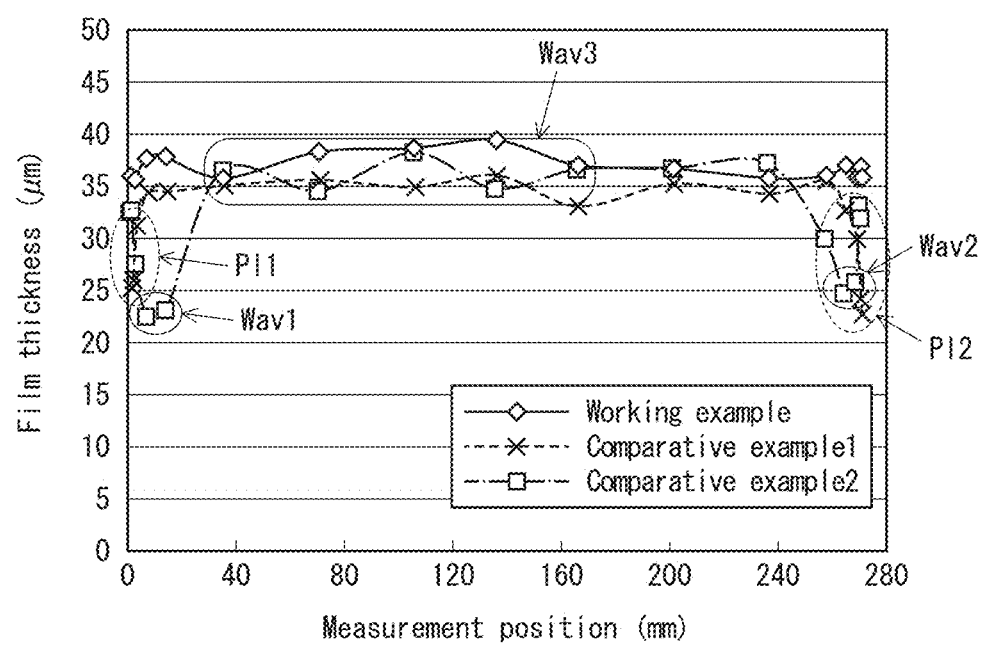
FIG. 16 is a graph of film thickness measurement results in the working example and the comparative examples 1 and 2 of the organic EL display panel 10 according to at least one embodiment.

FIG. 16 is a graph of film thickness measurement results in the working example and the comparative examples 1 and 2 of the display panel 10 according to at least one embodiment.

In the comparative example 1, film thickness at an upstream end of the column banks 522Y (position 0 mm) (position Pl1 in FIG. 16) is at most 10 nm less than film thickness at a position approximately 20 mm from the upstream end of the column banks 522Y.

Further, film thickness at a downstream end (position 270 mm) (position Pl2 in FIG. 16) is at most 13 nm less than film thickness at a position approximately 20 mm from the downstream end.

In the comparative example 2, a decrease in film thickness such as observed in the comparative example 1 was not observed at the upstream end (position 0 mm) and the downstream end (position 270 mm) of the column banks 522Y.

However, a concave was observed at a position (position Wav1 in FIG. 16) approximately 10 mm from the upstream end of the column banks 522Y where film thickness is at most 15 nm less than film thickness at a position approximately 30 mm from the upstream end.

Also, a concave was observed at a position (position Wav2 in FIG. 16) approximately 10 mm from the downstream end of the column banks 522Y where film thickness is at most 13 nm less than film thickness at a position approximately 30 mm from the downstream end.

Further, unevenness (waviness) having an amplitude of at most approximately 4 nm in a cycle of approximately 65 mm was observed at a position (position Wav3 in FIG. 16) approximately 30 mm inward from the upstream end.

In contrast, in the working example of the display panel 10, a variation in film thickness by 4 nm or less was measured at both the upstream end (position 0 mm) and the downstream end (position 270 mm) of the column banks 522Y.

From the results above, the uniformity of film thickness of functional layers in the column shaped application region along one of the gaps 522z between two adjacent ones of the column banks 522Y is improved in the working example of the display panel 10 in comparison to the comparative examples 1 and 2 manufactured by using the respective ink drying devices in which the distance between the rectifying plate 400 and the upper surface of the substrate 100x is respectively fixed to 5 mm and 50 mm.

[Regarding Film Thickness Measurement Results]

The following is an analysis of the film thickness measurement results for the light emitting layers 123 obtained from the working example and the comparative examples 1 and 2 of the display panel 10.

Comparative Example 1

(1) Film Thickness Variation Caused by Uneven Vapor Concentration Distribution of Ink Solvent in Central and Peripheral Portions of Substrate)

With respect to a wet process of forming a functional layer by a method of applying ink to a substrate and drying the ink, the inventors studied variation in film shape due to differences in drying speed between a central portion of a display region and peripheral portions of the display region on the substrate.

Figure 17A:
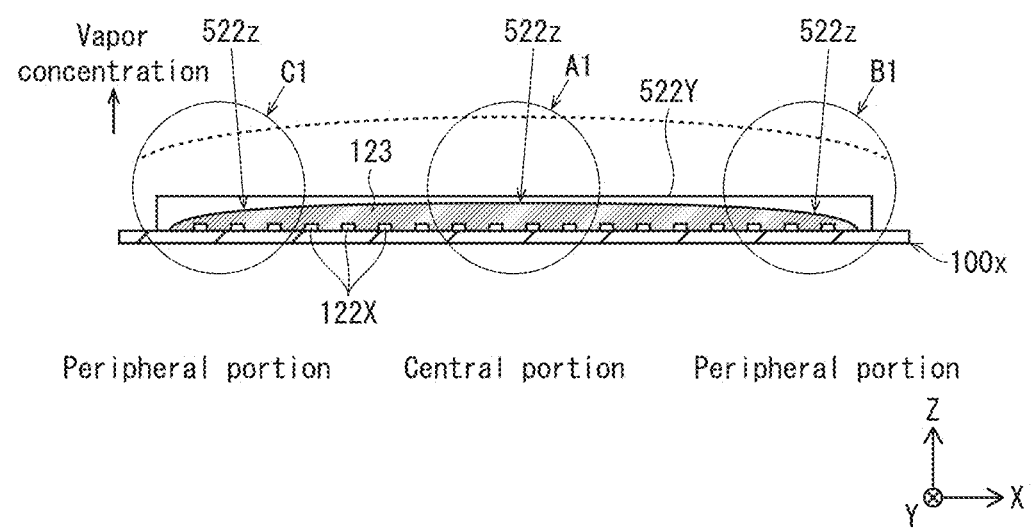
FIG. 17A is a schematic view of a vapor pressure distribution in a central portion and peripheral portions of a display region in the comparative example 1 according to at least one embodiment.
Figure 17B:
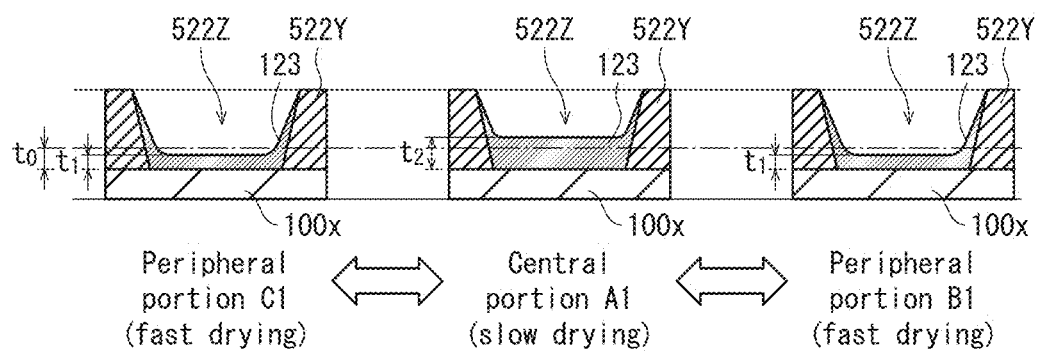
FIG. 17B is a schematic view showing differences in film shape between the central portion and the peripheral portions of the display region due to an influence of the vapor pressure distribution in the comparative example 1 according to at least one embodiment.

FIG. 17A is a schematic view of a vapor pressure distribution in the central portion and the peripheral portion of the display region in the comparative example 1 according to at least one embodiment. FIG. 17B is a schematic view showing differences in film shape between the central portion and the peripheral portion of the display region due to an influence of the vapor pressure distribution in the comparative example 1 according to at least one embodiment. In FIG. 17A, reference numeral 100x indicates the substrate, and reference numeral 522Y indicates column banks provided on the substrate 100x, adjacent ones of the column banks 522Y defining the gaps 522z. Reference numeral 122X indicates row banks that are provided perpendicular to the column banks 522Y, and reference numeral 123 indicates ink applied to the gaps 522z for the purpose of forming light emitting layers.

As described above, the results in the comparative example 1 demonstrate that the light emitting layers 123 are thinner in the vicinity of side walls and thicker at pixel centers in sub pixels of a central portion A1 of a display region, compared with sub pixels of peripheral portions B1 and C1 of the display region which are located near an edge of the partitioned region 10a.

This is because of the following reasons. In FIG. 17A, in the comparative example in which the distance between the rectifying plate 400 and the upper surface of the substrate 100x is fixed to 50 mm in the ink drying process, ink solvent vapor concentration is relatively low and drying is fast in the sub pixels of the peripheral portions B1 and C1 of the display region, which are located near the edge of the partitioned region 10a, compared with the sub pixels of the central portion A1 of the display region. Thus, in FIG. 17B, in the central portion A1 in which drying is slow, in the process of solvent evaporation, due to the influence of the vapor pressure distribution, a large amount of solid components of the ink of the light emitting layers 123 sediment and move to the bottom of the gaps 522z, increasing film thickness t2 at the bottom compared with a reference film thickness t0. In contrast, for the peripheral portions B1 and C1 in which drying is fast, in the process of solvent evaporation, due to the influence of the vapor pressure distribution, a small amount of solid components of the ink of the light emitting layers 123 sediment and move to the bottom of the gaps 522z, reducing film thickness t1 at the bottom compared with the reference film thickness t0.

Thus, in the comparative example 1, due to the influence of the vapor pressure distribution, film thickness variation occurs due to imbalance in solvent evaporation rate due to uneven vapor concentration distribution of ink solvent between a central portion and a peripheral portion of the substrate in the row and column directions thereof.

(2) Film Thickness Variation Caused by Imbalance of Ink Surface Tension Between Central and Peripheral Portions of Gaps 522*z* (Column Shaped Application Regions) on a Substrate According to the configuration in which light emitting layers 123 are formed by applying ink to elongated column shaped application regions, the applied ink is continuous mainly in the column direction, and thus film thickness variation occurs due to imbalance in ink surface tension in the gaps 522*z* (column shaped application regions).

Figure 18A:
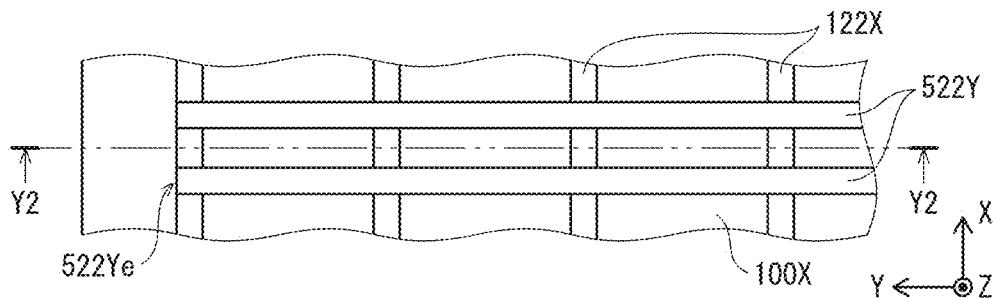
FIG. 18A is a schematic plan view around column bank end portions in the comparative example 1 according to at least one embodiment.
Figure 18B:
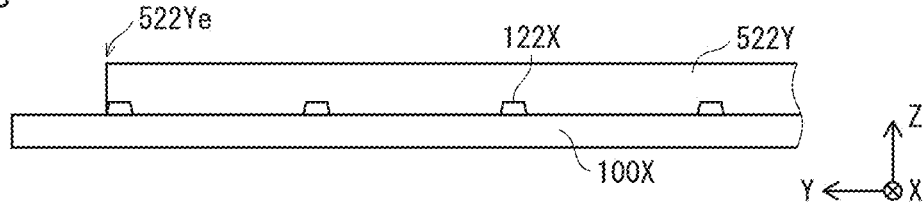
FIG. 18B is a schematic side cross section taken along Y2-Y2 in FIG. 18A according to at least one embodiment.

FIG. 18A is a schematic plan view of the substrate 100*x* in the vicinity of the column-direction end 522Ye of the column banks 522Y in the comparative example 1 according to at least one embodiment. FIG. 18B is a schematic side cross section taken along Y2-Y2 in FIG. 18A according to at least one embodiment. FIG. 18D is a schematic side cross section taken along Y2-Y2 of FIG. 18A, showing film thickness variation of light emitting layer 123Y over time according to at least one embodiment. In FIG. 18A and FIG. 18B, the column banks 522Y and the row banks 122X are provided on the substrate 100*x*.

In FIG. 18D, for ink of the light emitting layer 123Y applied on the substrate 100*x* of the comparative example 1 in which the distance between the rectifying plate 400 and the upper surface of the substrate 100*x* is fixed to 50 mm, drying of the solvent starts from the column-direction end 522Ye of the column banks 522Y.

This is because as described above, in a wet process, in the process of evaporating and drying the solvent of the ink, solvent vapor pressure is lower in a peripheral portion of a film forming area than in a central portion thereof, and therefore an evaporation rate of the solvent is greater. Here, a film forming area is an area in which ink is applied by a wet process, and is the same region as the partitioned region 10*a* in FIG. 1. Thus, as evaporation of the solvent proceeds due to drying, evaporation of the solvent is slower for ink inwards of the column-direction ends 522Ye for which remaining solvent is greater per unit area than for ink in the vicinity of the column-direction ends 522Ye for which remaining solvent is less per unit area, causing nonuniform surface tension. Ink in the vicinity of the column-direction ends 522Ye is pulled inward by the surface tension from the ink inward of the column-direction ends 522Ye, causing ink convection directed inwards. As a result, ink in the vicinity of the column-direction ends 522Ye moves inwards, and ink film thickness inwards of the column-direction ends 522Ye increases.

Specifically, FIG. 18D includes upper (earlier) and lower (later) stages, and in FIG. 18D, drying of the solvent gradually progresses inwards from the column-direction ends 522Ye over time, and ink film thickness inwards of the column-direction ends 522Ye also gradually increases due to the movement of ink in this direction. Eventually, ink film thickness reaches a maximum in a central portion of the film forming area, and film shape of the light emitting layers 123Y formed also have a maximum film thickness in the central portion in the column direction of the film forming area.

Figure 19:
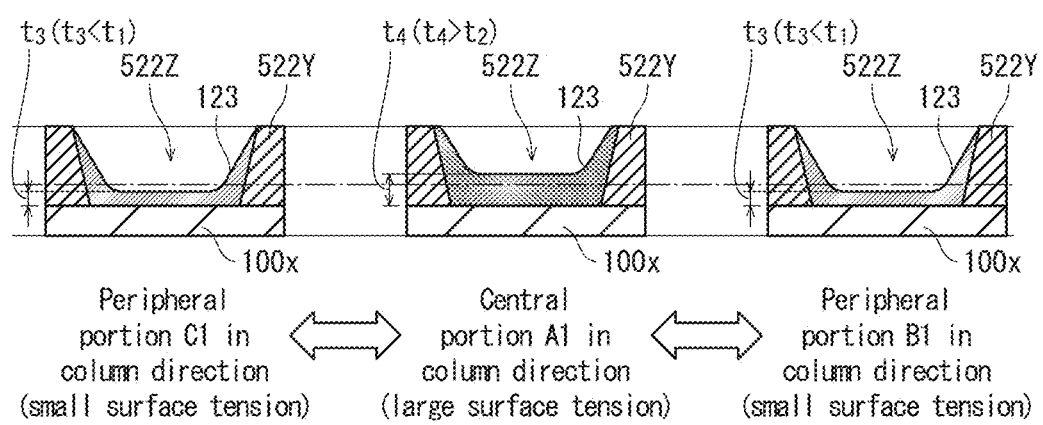
FIG. 19 is a schematic view of differences in film shape between the central portion and the peripheral portions of the display region in the comparative example 1 according to at least one embodiment.

FIG. 19 is a schematic view of differences in film shape between the central portion and the peripheral portions in the comparative example 1 according to at least one embodiment. In FIG. 19, since the solid component of ink of the light emitting layers 123 flows to the central portion A1 from the peripheral portions B1 and C1, the central portion A1 has a further increased film thickness t4 at the bottom compared with the film thickness t2. In contrast, since the solid component of ink of the light emitting layers 123 flows to the central portion A1 from the peripheral portions B1 and C1, the peripheral portions B1 and C1 have a further reduced film thickness t3 at the bottom compared with the film thickness t1.

Thus, in the comparative example 1, film thickness variation occurs due to imbalance in ink surface tension between a central portion and a peripheral portion in the column direction.

(3) Film Thickness Variation that Locally Occurs Immediately After Ink Application due to Variation in Ink Ejection Amount of Ejection Ports According to the configuration in which light emitting layers 123 are formed by applying ink to elongated column shaped application regions, film thickness variation is caused by factors such as variation in ink ejection amount and non ejection of ejection openings 624*d*1. This film thickness variation is prominent immediately ink application.

Figure 18C:
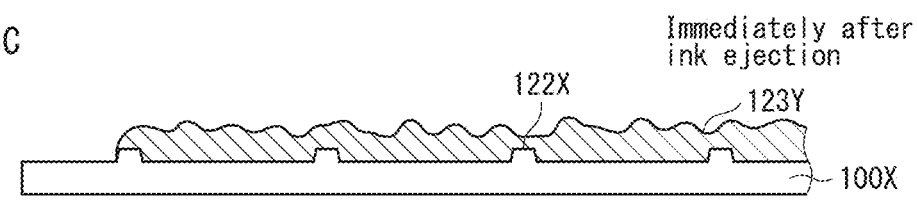
FIG. 18C is a schematic view of film shape immediately after ink ejection in the comparative example 1 according to at least one embodiment.
Figure 18D:
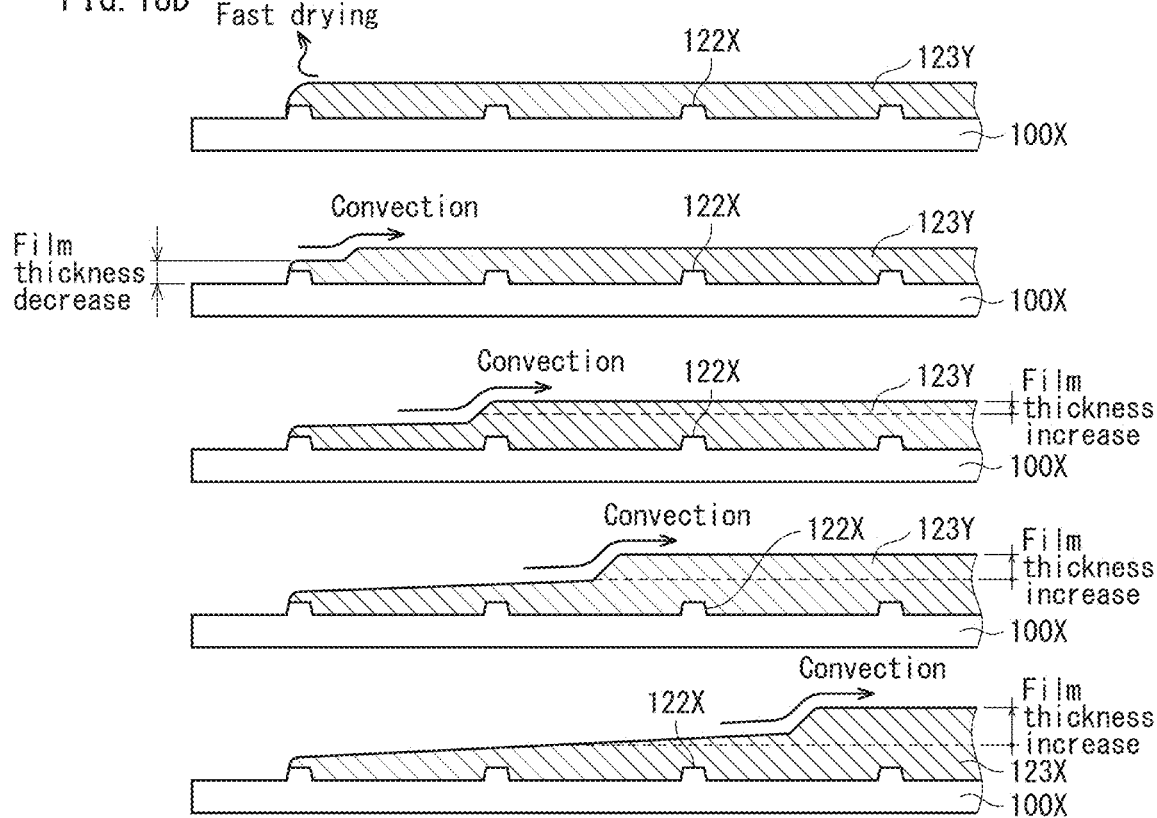
FIG. 18D is a schematic side cross section showing film thickness variation over time in the comparative example 1 according to at least one embodiment.

FIG. 18C is a schematic view of film shape immediately after ink ejection. According to the inkjet method, in FIG. 10, the substrate 100*x* is placed on a work table of a droplet ejecting device in a state in which the column banks 522Y extend along the Y direction, and an inkjet nozzle head 622 in which ejection openings 624*d*1 are arranged in a line along the Y direction is scanned across the X direction while ink aimed at deposition targets set in the gaps 522*z* between the column banks 522Y is deposited from the ejection openings 624*d*1. The ink ejection amount typically varies among the ejection openings 624*d*1 which are arranged in a line. Also, ejection from part of the ejection openings 624*d*1 is sometimes suspended depending on results of ejection quality tests performed in advance. Accordingly, film thickness variation occurs along the gaps 522*z* due to factors such as variation in ink ejection amount and non-ejection of the ejection ports 624*d*1. This film thickness variation is prominent immediately after ink application. The ink in the gaps 522*z* moves in the column direction over time and thus to be levelled, reducing the film thickness variation.

In the comparative example 1, since the distance between the rectifying plate 400 and the upper surface of the substrate 100*x* is fixed to 50 mm, evaporation of solvent from the ink proceeds before the film thickness variation is sufficiently reduced due to movement of the ink in the gaps 522*z* in the column direction. As a result, movement of the ink in the gaps 522*z* in the column direction is restricted, and this inevitably causes film thickness variation due to variation in ink ejection amount immediately after ejection.

Comparative Example 2

(1) Improvement of Film Thickness Variation Caused in the Comparative Example 1

In the comparative example 2, a decrease in film thickness such as observed in the comparative example 1 was not observed at the upstream end (position 0 mm) and the downstream end (position 270 mm) of the column banks 522Y.

Figure 20A:
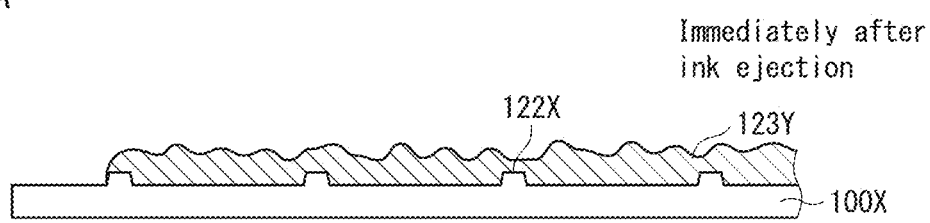
FIG. 20A is a schematic view of film shape immediately after application in the comparative example 2 according to at least one embodiment.
Figure 20B:
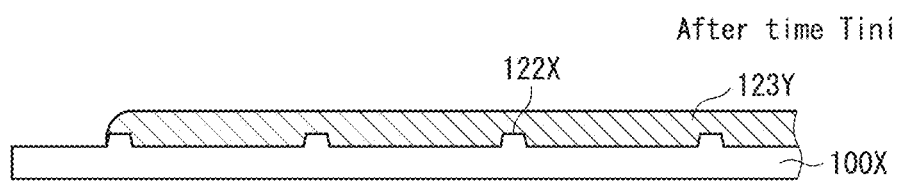
FIG. 20B is a schematic view of levelled film shape immediately after application in the comparative example 2 according to at least one embodiment.

FIG. 20A is a schematic view of film shape immediately after application in the comparative example 2 according to at least one embodiment. FIG. 20B is a schematic view of levelled film shape immediately after application in the comparative example 2 according to at least one embodiment. In FIG. 20A, also in the comparative example 2, film thickness variation occurs immediately after ink ejection due to variation in ink ejection amount in the gaps 522*z* which constitute the column shaped application regions. However, in the comparative example 2, since the distance between the rectifying plate 400 and the upper surface of the substrate 100x is fixed to 5 mm, vapor pressure increases in the space between the rectifying plate 400 and the substrate 100x, suppressing evaporation of the ink solvent. In FIG. 20B, this promotes movement in the column direction of the ink in the gaps 522z on the substrate 100x, and accordingly the ink in the gaps 522z moves in the column direction and this is levelled, sufficiently reducing the film thickness variation in the time Tini.

Figure 21A:
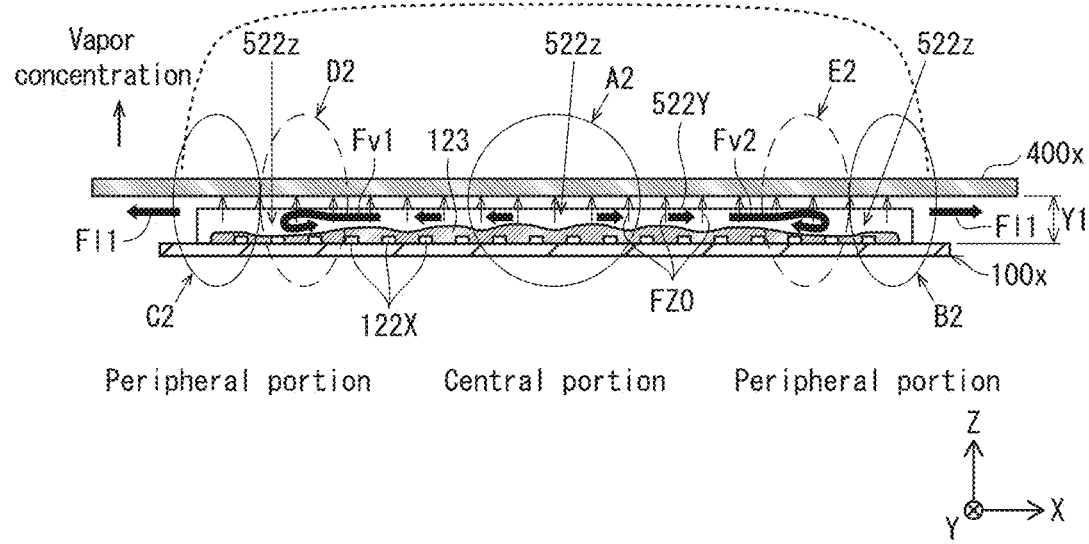
FIG. 21A is a schematic view of a vapor pressure distribution in a central portion and peripheral portions of a display region and a vapor flow in a space between a substrate and a rectifying plate in the comparative example 2 according to at least one embodiment.
Figure 21B:
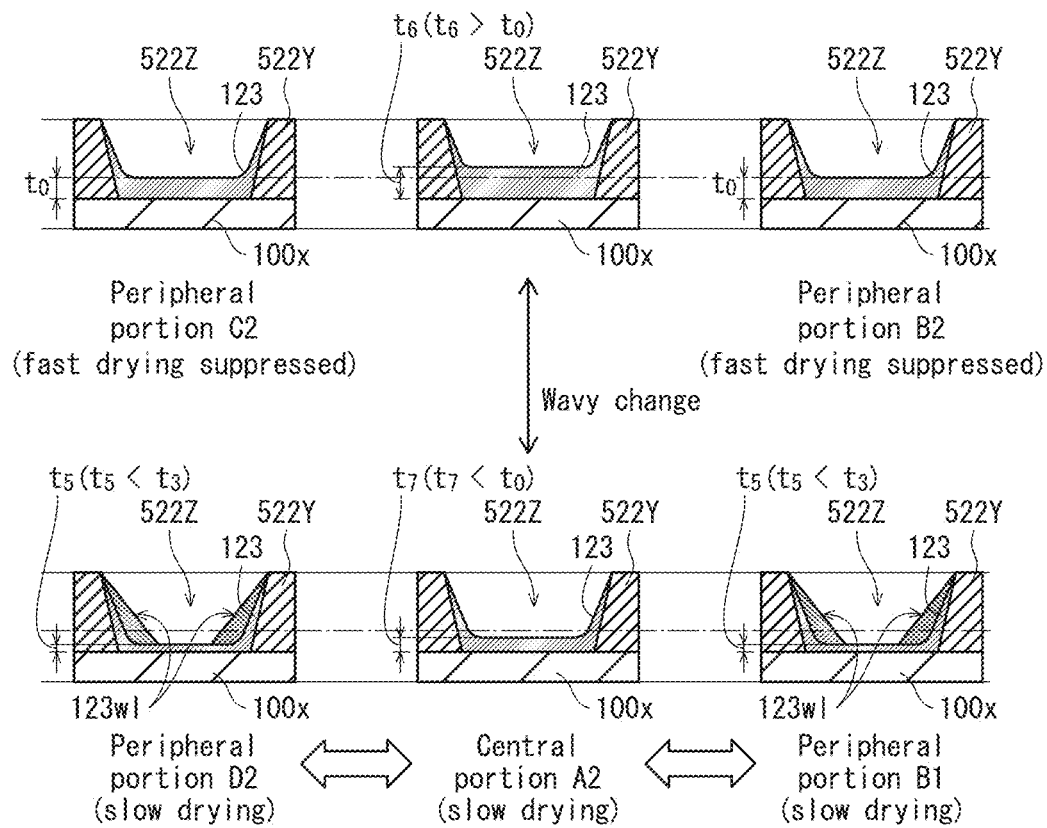
FIG. 21B is a schematic view of differences in film shape between the central portion and the peripheral portions of the display region in the comparative example 2 according to at least one embodiment.

FIG. 21A is a schematic view of a vapor pressure distribution in a central portion and peripheral portions of a display region and a vapor flow in a space between the substrate and the rectifying plate in the comparative example 2 according to at least one embodiment. FIG. 21B is a schematic view of differences in film shape between the central portion and the peripheral portions of the display region in the comparative example 2 according to at least one embodiment.

In FIG. 21B, the film thickness does not vary from the reference film thickness t0 in the peripheral portions B2 and C2. As described above, in the comparative example 2, since the distance between the rectifying plate 400 and the upper surface of the substrate 100x is fixed to 5 mm, the vapor pressure increases in the space between the rectifying plate 400 and the substrate 100x, suppressing evaporation of the ink solvent. This suppresses film thickness variation caused by imbalance in solvent evaporation rate due to uneven vapor concentration distribution of ink solvent between the central portion and the peripheral portions of the substrate. Also, drying of the solvent is prevented from starting from the column-direction ends 522Ye. This prevents the solid component of the ink of the light emitting layers 123 from flowing to the central portion A1 due to imbalance in ink surface tension between the central portion and the peripheral portions of the substrate in the column direction. As a result, the peripheral portions B2 and C2 have a film thickness at the bottoms that is equal to the reference thickness t0.

(2) Film Thickness Variation due to Turbulence of air Flow in Space Between Rectifying Plate 400 and Substrate 100x In the comparative example 2, as described above, unevenness (waviness) having an amplitude of at most approximately 4 nm in a cycle of approximately 65 mm was observed at a position (Wav3 in FIG. 16) approximately 30 mm inward from the upstream end. In observation of the cross section in the row direction in the comparative example 2, in FIG. 21B, film thickness at a central portion A2 varies between a film thickness t6 which is larger than the reference film thickness t0 and a film thickness t7 which is smaller than the reference film thickness t0.

In the comparative example 2, since the distance between the rectifying plate 400 and the upper surface of the substrate 100x is fixed to 5 mm, vapor FZ0 of the ink solvent evaporated from the partitioned region 10a of the substrate 100x is prevented from moving across the substrate 100x in the space between the rectifying plate 400 and the substrate 100x. That is, the vapor FZ0 of the ink solvent evaporated from the partitioned region 10a is forced in the space with the height Y1 between the substrate 100x and the rectifying plate 400, and thus vapor pressure in the space increases. Thus, a flow path resistance caused by the substrate 100x and the rectifying plate 400 increases, and the vapor remains in the space. Then, turbulence of vapor flows Fv1 and Fv2 in the space occur to make an air flow like a turbulent flow, and a minute amount of vapor Fl1 is exhausted laterally through the rectifying plate 400. In this way, the film thickness variation having unevenness (waviness) in the comparative example 2 is caused by turbulence of the vapor flows Fv1 and Fv2 in the space between the substrate 100x and the rectifying plate 400.

(3) Film Thickness Variation due to Variation in Cross Sectional Shape and an Flow in Space In the comparative example 2, as described above, a concave was observed at the position Wav1 approximately 10 mm from the upstream end of the column banks 522Y where film thickness is at most 15 nm less than film thickness at a position approximately 30 mm from the upstream end. Also, a concave was observed at the position Wav2 approximately 10 mm from the downstream end of the column banks 522Y where film thickness is at most 13 nm less than film thickness at a position approximately 30 mm from the downstream end.

In observation of the cross section in the row direction, in FIG. 21B, peripheral portions D2 and E2 have a larger film thickness of ink 123w1 on side walls of the banks 522Y, and have a film thickness t5 at the bottoms of the gaps 522z that is further smaller than the film thickness t3 at the peripheral portions in the comparative example 1.

This film thickness variation, like the film thickness variation at the central portion A2, is influenced by turbulence of the vapor flows Fv1 and Fv2 in the space between the substrate 100x and the rectifying plate 400. In addition, in the comparative example 2, since the vapor pressure in the space between the substrate 100x and the rectifying plate 400 increases and thus evaporation of the ink solvent is suppressed, a decrease in evaporation rate causes a larger amount of solute component of the ink to remain on the side walls of the banks 522Y.

(Working Example of Method of Manufacturing Display Panel 10 According to at Least One Embodiment)

(1) Reduction of Film Thickness Variation in the Comparative Example 1

Figure 22A:
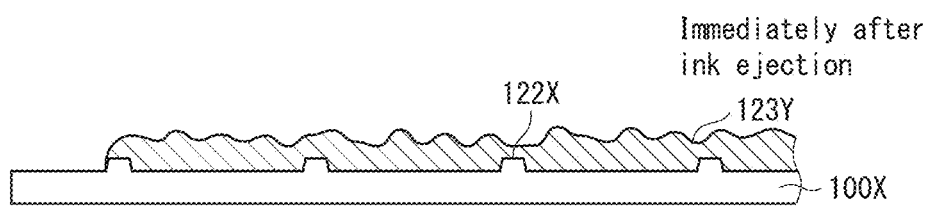
FIG. 22A is a schematic view of film shape immediately after application in the working example according to at least one embodiment.
Figure 22B:
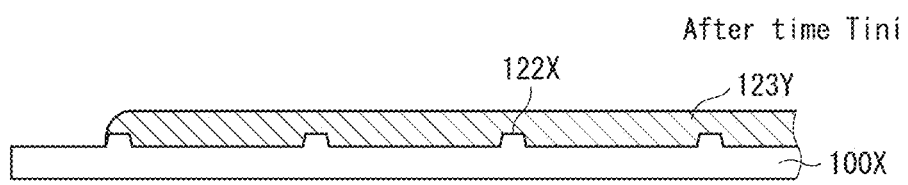
FIG. 22B is a schematic view of levelled film shape immediately after application in the working example according to at least one embodiment.

FIG. 22A is a schematic view of film shape immediately after application in the working example according to at least one embodiment. FIG. 22B is a schematic view of levelled film shape immediately after application in the working example according to at least one embodiment. In FIG. 22A, also in the working example, film thickness variation occurs immediately after ink ejection due to variation in ink ejection amount in the gaps 522z which constitute the column shaped application regions. However, in the working example, in a time from start of pressure reduction to start of the time Tini in which the pressure in the chamber 500 is reduced to the first pressure P1, since the distance between the rectifying plate 400 and the upper surface of the substrate 100x is fixed to 5 mm, vapor pressure in the space between the rectifying plate 400 and the substrate 100x increases and thus evaporation of the ink solvent is suppressed. In FIG. 22B, this promotes movement in the column direction of the ink in the gaps 522z on the substrate 100x, and accordingly the ink in the gaps 522z moves in the column direction and is levelled. Thus, film thickness variation is sufficiently suppressed in the time Tini also in the working example.

Figure 22C:
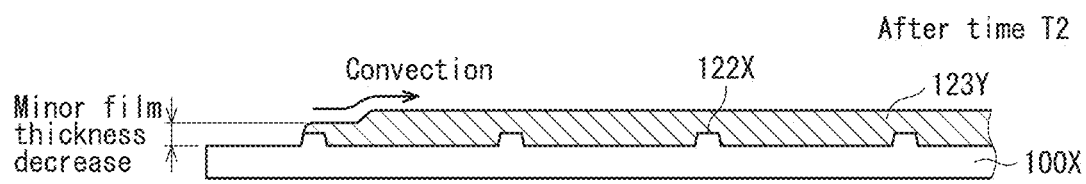
FIG. 22C is a schematic side cross section of film thickness variation at column direction ends in the working example according at least one embodiment.

FIG. 22C is a schematic side cross section of film thickness variation at the column direction ends 522Ye in the working example according at least one embodiment. In the working example, as described above, evaporation of the ink solvent vapor is suppressed until start of the time Tini, and this suppresses film thickness variation due to imbalance in solvent evaporation rate caused by uneven vapor concentration distribution of the ink solvent between the central portion and the peripheral portions of the substrate. Also, drying of the solvent is prevented from starting from the column direction ends 522Ye. In FIG. 22C, this suppresses film thickness variation due to imbalance in ink surface tension between the central portion and the peripheral portions of the substrate in the column direction even after the time point T2 when the pressure in the chamber 500 is reduced to the second pressure P2 or lower.

Figure 23A:
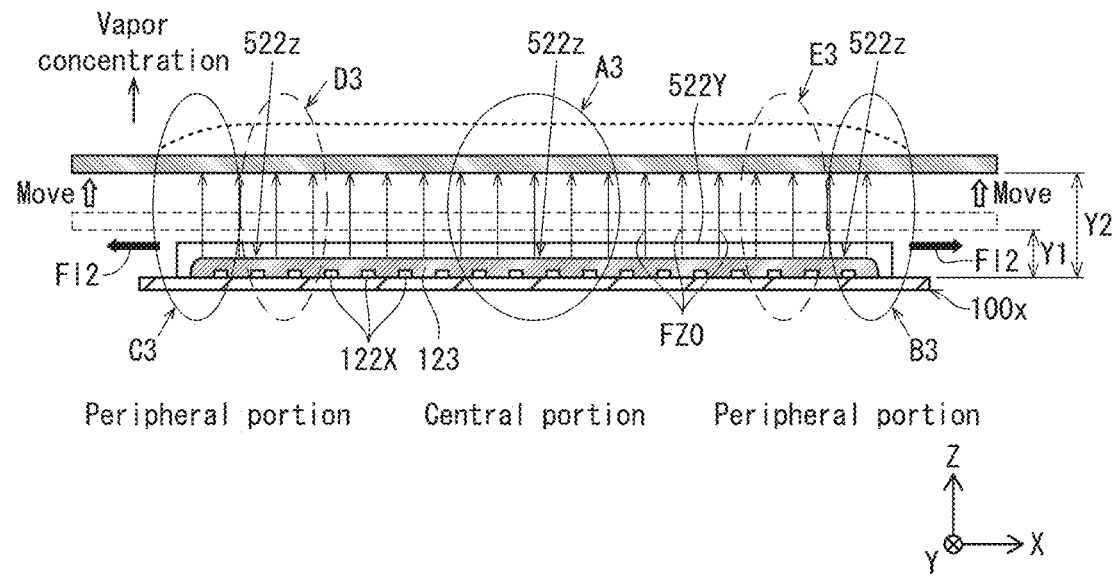
FIG. 23A is a schematic view of a vapor pressure distribution in a central portion and peripheral portions of a display region and a vapor flow in a space between a substrate and a rectifying plate in the working example according to at least one embodiment.
Figure 23B:
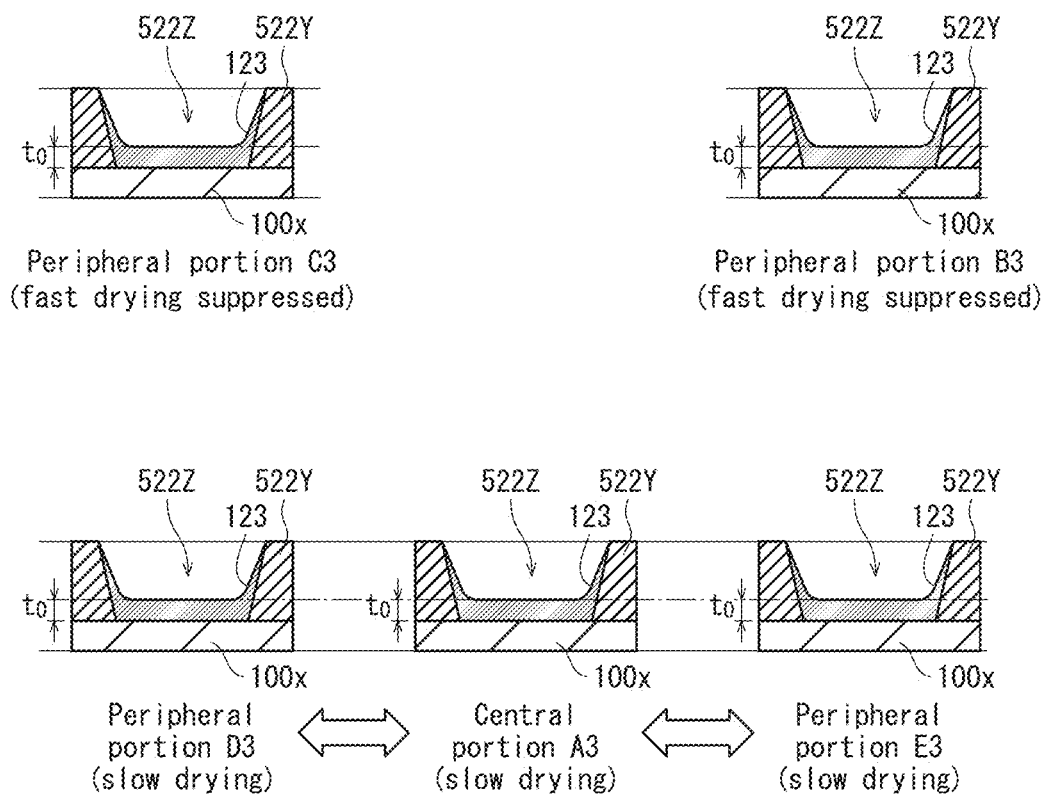
FIG. 23B is a cross section showing differences in film shape between the central portion and the peripheral portions of the display region in the working example according to at least one embodiment.

FIG. 23B is a cross section of differences in film shape between the central portion and the peripheral portions of the display region in the working example according to at least one embodiment. In observation of the cross section in the row direction in the working example, in FIG. 23B, peripheral portions B3 and C3 have a film thickness that is equal to the reference thickness t0.

(2) Reduction of Film Thickness Variation in the Comparative Example 2

FIG. 23A is a schematic view of a vapor pressure distribution in a central portion and peripheral portions of a display region and a vapor flow in a space between the substrate and the rectifying plate in the working example according to at least one embodiment.

In observation of the cross section in the row direction in the working example, in FIG. 23B, the central portion A3 has a film thickness at the bottoms of the gaps 522z that is equal to the reference thickness t0.

In the working example, while the distance between the rectifying plate 400 and the upper surface of the substrate 100x is regulated to the first distance Y1, the pressure in the chamber 500 is reduced in the time Tini from atmospheric pressure to the first pressure P1. Then, the rectifying plate 400 is positioned at the second distance Y2 from the upper surface of the substrate 100x. This promotes, in the space between the substrate 100x and the rectifying plate 400, movement of the vapor FZ0 of the ink solvent, which is evaporated from the partitioned region 10a of the substrate 100x, across the substrate 100x. That is, the vapor Air2 of the ink solvent evaporated from the partitioned region 10a is released in the space with the height Y2 between the substrate 100x and the rectifying plate 400, and thus the vapor pressure in the space decreases. Thus, since the flow path resistance caused by the substrate 100x and the rectifying plate 400 decreases, the vapor Air2 moves in the space between the substrate 100x and the rectifying plate 400 with slight resistance, and thus is exhausted laterally through the rectifying plate 400 (air flow Fl2). Thus, in the working example, the vapor flows Fv1 and Fv2 in the space do not become a turbulent flow unlike in the comparative example 2, and thus film thickness variation having unevenness (waviness) like in the comparative example 2 is eliminated.

Also, in observation of the cross section in the row direction in the working example, in FIG. 21B, peripheral portions D3 and E3 have a film thickness at the bottoms of the gaps 522z that is equal to the reference thickness t0.

In the working example, while the rectifying plate 400 is positioned at the second distance Y2 from the upper surface of the substrate 100x, the pressure in the chamber 500 is reduced from the first pressure. This promotes evaporation of the solvent remaining in the ink, and thus prevents a larger amount of solute component of the ink from remaining on the side walls of the banks 522Y clue to suppression of evaporation of the ink solvent, unlike in the comparative example 2. Therefore, phenomenon like in the comparative example 2 does not occur in the working example. In other words, the working example does not have concaves of the film at the peripheral portions, that is, does not have film thickness that is larger at the inks on the side walls of the banks 522Y and is further smaller at the bottoms of the gaps 522z than in the comparative example 1.

As described above, in the working example, the causes of film thickness variation are alleviated compared to the comparative examples 1 and 2, such as imbalance in solvent evaporation rate due to uneven vapor concentration distribution of the ink solvent in the central portions and the peripheral portions of the substrate, imbalance of ink surface tension, insufficient levelling of ink ejection amounts after ejection, steam flow turbulence in the space between the substrate and the rectifying plate, and variation in cross sectional shape of film caused by decrease in solvent evaporation rate. Therefore, in the working example, an amount of film thickness variation is reduced compared to the comparative examples 1 and 2.

<Outline>

The inventors' study proved the following characteristics of a display panel having line banks in which light emitting layers 123 are formed by applying ink containing organic light emitting material to column shaped application regions, which are constituted from gaps 522z between adjacent ones of elongated banks 522Y, so that the applied ink is continuous. In such a display panel, film thickness variation at column direction ends 522Ye easily influences an inward region including a partitioned region 10a on a substrate 100x due to the applied ink being continuous mainly in the column direction, compared with display panels having pixel banks in which light emitting layers are isolated in the shape of islands for each pixel. When a conventional ink drying method is applied to the display panel in which the light emitting layers 123 are formed by applying ink to the elongated column shaped application regions so that the applied ink is continuous, functional layers have uneven film thickness in the column shaped application regions on the substrate due to uneven vapor pressure distribution of ink solvent. This is a cause of luminance nonuniformity.

In response to this, the method of manufacturing the display panel 10 according to at least one embodiment includes: forming pixel electrodes in a matrix on a substrate 100x, wherein the matrix comprises rows and columns; includes arranging column banks 522Y, which extend in a column direction, above the substrate along a row direction, wherein each of the column banks is between adjacent pixel electrodes in the row direction; applying ink containing organic light emitting material to gaps 522z between adjacent column banks, wherein the applied ink is continuous in the column direction; reducing a pressure of an atmosphere including the substrate to a first pressure P1 while positioning a rectifying plate 400 at a first distance Y1 from an upper surface of the substrate, wherein the rectifying plate covers a region with the ink applied on the substrate in a plan view; reducing, after the reducing of the pressure of the atmosphere to the first pressure, the pressure of the atmosphere to a second pressure P2 or lower while positioning the rectifying plate at a second distance Y2 from the upper surface of the substrate, wherein the second pressure is lower than the first pressure, and the second distance is greater than the first distance; heating the substrate to form an organic functional layer 123; and forming a counter electrode 125 above the organic functional layer.

According to the method of manufacturing the display panel 10, the heating of the substrate alleviates causes of film thickness variation, such as imbalance in solvent evaporation rate due to uneven vapor concentration distribution of ink solvent between the central portion and the peripheral portions of the substrate, imbalance of ink surface tension in the column shaped application regions, insufficient levelling of ink ejection amounts after ejection in the column shaped application regions, steam flow turbulence in the space between the substrate and the rectifying plate, and variation in cross sectional shape of film caused by decrease in solvent evaporation rate. Therefore, the film shape and film thickness of the light emitting layers 123 formed in the column shaped application regions become uniform in both the central portion and the peripheral portions of the film forming area. This allows uniformity in film thickness of the light emitting layers in the column shaped application regions on the substrate, thereby reducing luminance nonuniformity across the organic EL display panel.

As described above, according to a method of manufacturing an organic EL display panel according to at least one aspect of the present disclosure, improvement in luminance uniformity across the organic EL display panel is possible by making film thickness more uniform for light emitting layers in column shaped application regions on a substrate.

The method of manufacturing the display panel 10 according to at least one embodiment has been described, but the present invention is not limited to the embodiment above. For example, various modifications of embodiments conceived by a person having ordinary skill in the art, and any combination of elements and functions of embodiments and modifications that does not depart from the spirit of the present invention are also included in the present invention. The following describes such embodiments of the method of manufacturing the display panel 10.

(1) Regarding at least one embodiment, no description was provided specifying the number of sheets of the display panel 10 formed simultaneously from one substrate in mass production of the display panel 10. However, in mass production of the display panel 10, when multiples of the display panel 10 are formed from one substrate, each partitioned region 10a of each display panel 10 is of course one film forming area. This is because, even in the case of multiples of the display panel 10 being formed from one substrate, when adjacent film forming areas (partitioned regions 10a) are separated from each other by at least a predefined distance, solvent vapor pressure in a peripheral portion of each film forming area is less than in a central portion thereof.

(2) According to at least one embodiment above, in FIG. 1 for example, the display panel 10 represents an example in which the substrate 100x has the partitioned region 10a in which the column banks 522Y and the row banks 122X are arranged defining light emitting units of each color R, G, and B, partitioned in a matrix, and the non-partitioned region 10b (10Xb and 10Yb in the X and Y directions, respectively, and 10b where no distinction is required). However, a peripheral partitioned region partitioned by a lattice-like insulating layer may be provided around all or part of the partitioned region 10a in which the column banks 522Y and the row banks 122X are arranged. Ink for forming red light emitting layers, green light emitting layers, and blue light emitting layers is applied in the peripheral partitioned region in the portioned partitioned by lattice-like insulating layers, as in the partitioned region 10a. Further, the non-partitioned region 10b may be provided around the peripheral partitioned region.

(3) According to at least one embodiment above, in FIG. 1, in the display panel 10, the non-light emitting region 10ne is formed without the organic EL display elements 100 in a predefined number of sections from the outer edge of the partitioned region 10a on the substrate 100x. However, the pixel electrodes 119 may be provided in each section on the substrate 100x as the display element region 10e, as far as the column-direction ends 522Ye of the column banks 522Y. Therefore, effectively utilizing the film formation area on the substrate and enlarge the display element region 10e, contributing to cost reduction is possible.

(4) According to the display panel 10, above the sub pixels 100se in the gaps 522z, the upper substrate 130 made of a light transmissive material and the color filter layer 128 are provided. However, for the example of the display panel 10, the upper substrate made of a light transmissive material need not be provided, and the color filter layer 128 need not be provided above the gaps 522z. Thus, in addition to suppressing reflection of external light and improving light emission efficiency, manufacturing cost can be reduced.

(5) According to the display panel 10, the light emitting layers 123 are continuous in the column direction over the row banks. However, the light emitting layers 123 may be discontinuous and separated by the row banks into individual pixels. Even according to this configuration, luminance nonuniformity caused by distribution of ink solvent vapor concentration can be reduced.

(6) According to the display panel 10, colors of light emitted by the light emitting layers 123 of sub pixels 100se in the gaps between the column banks 522Y that are adjacent in the row direction are different from each other, and color of light emitted by the light emitting layers 123 of sub pixels 100se in the gaps between the row banks 122X that are adjacent in the column direction is the same. However, the color of light emitted by the light emitting layers 123 of sub pixels 100se that are adjacent in the row direction may be the same, and colors of light emitted by the light emitting layers 123 of sub pixels 100se that are adjacent in the column direction may be different. Alternatively, for both the column and row directions, colors of light emitted by the light emitting layers 123 of sub pixels 100se that are adjacent may be different. Even according to this configuration, luminance nonuniformity caused by distribution of ink solvent vapor concentration can be reduced.

According to the display panel 10 according to at least one embodiment, there are three colors of the pixels 100e: red pixels, green pixels, and blue pixels, but the present invention is not limited to this example. For example, there may be only one color of light emitting layer, or there may be four colors of light emitting layer such as red, green, blue, and yellow.

Further, according to at least one embodiment described above, the pixels 100e are arranged in a matrix shape, but the present invention is not limited to this. For example, when the pixel regions are spaced at one pitch, the effects of the present invention are achieved even when the pixel regions are shifted by a half pitch in the column direction between adjacent gaps. In a high definition display panels, visually distinguish slight shifts in the column direction and even if film thickness unevenness on a straight line (or staggered line) having a certain width is lined up is difficult, as the shifts in the column direction are visually recognized as a hand shape. Accordingly, improving display quality of a display panel, suppressing luminance nonuniformity, by using a staggered line arrangement is possible.

Further, according to the display panel 10, the pixel electrodes 119 are disposed in all of the gaps 522z, but the present invention is not limited to this configuration. For example, gaps 522z in which the pixel electrodes 119 are not formed may exist, for the purpose of forming a bus bar, or the like.

Further, according to at least one embodiment above, the hole injection layers 120, the hole transport layers 121, the light emitting layers 123, and the electron transport layer 124 are present between the pixel electrodes 119 and the counter electrode 125, but the present invention is not limited to this. For example, a configuration may be used in which only the light emitting layers 123 are present between the pixel electrodes 119 and the counter electrode 125, without using the hole injection layers 120, the hole transport layers 121, and the electron transport layer 124. Further, for example, a configuration may be used in which hole injection layers, hole transport layers, an electron transport layer, an electron injection layer, or the like is present, and a configuration may be used inn which some or all of these layers are present. Further, in at least one embodiment, at least one of these layers does not include organic compounds, and a configuration may be used in which an inorganic compound is used.

Further, according to at least one embodiment above, a wet process such printing, spin coating, inkjets, or the like is used as a method of forming the light emitting layers 123, but the present invention is not limited to these examples. For example, a dry process can be used such as vacuum deposition, electron beam deposition, sputtering, reactive sputtering, ion plating, vapor phase growth, or the like. Further, publicly-known materials may be appropriately used as materials of each component.

According to at least one embodiment above, a configuration is used in which pixel electrodes 119, which are anodes in a lower portion of EL elements, are connected to TFT sources, but a configuration may be used in which a counter electrode is in the lower portion of an EL element and an anode is disposed in an upper portion. In such a case, a cathode disposed in a lower portion is connected to a drain of the TFT.

Further, according to at least one embodiment above, a top-emission type of EL display panel is given as an example, but the present invention is not limited to this. For example, a bottom-emission type of display panel or the like can be used. In such a case, each configuration can be changed appropriately.

At least one embodiment described includes examples of the present invention. Values, shapes, materials, components, component positions and connections, processes, process order, and the like illustrated by the at least one embodiment do not indicate limitations of the present invention. Further, among the elements of at least one embodiment, processes not described in the independent claims that recite top level concepts of the present invention are described as elements of a different form.

Further, the order of processes described above are examples for at least one embodiment of the present invention, and may be different from the order described above. Further, a part of the processes described above may be executed simultaneously (in parallel) with another process.

Further, in order to facilitate understanding of the present invention, scale of the elements in each of the drawings mentioned for the embodiment above may be different from actual scale. Further, the present invention is not limited by the description of the embodiment, and can be appropriately changed without departing from the scope of the present invention.

Further, at least part of the functions of at least one embodiment and various modifications thereof may be combined.

Further, the present invention includes various modifications of at least one embodiment that may be conceived of by a person having ordinary skill in the art.

Although the technology pertaining to the present disclosure has been fully described by way of examples with reference to the accompanying drawings, various changes and modifications will be apparent to those skilled in the art. Therefore, unless such changes and modifications depart from the scope of the present disclosure, they should be construed as being included therein.

The invention claimed is:

1. A method of manufacturing an organic electroluminescence (EL) display panel, the method comprising:
   forming pixel electrodes in a matrix on a substrate, wherein the matrix comprises rows and columns;
   arranging column banks, which extend in a column direction, above the substrate along a row direction, wherein each of the column banks is between adjacent pixel electrodes in the row direction;
   applying ink containing organic light emitting material to gaps between adjacent column banks, wherein the applied ink is continuous in the column direction;
   reducing a pressure of an atmosphere including the substrate to a first pressure while positioning a rectifying plate at a first distance from an upper surface of the substrate, wherein the rectifying plate covers a region with the ink applied on the substrate in a plan view;
   reducing, after the reducing of the pressure of the atmosphere to the first pressure, the pressure of the atmosphere to a second pressure while positioning the rectifying plate at a second distance from the upper surface of the substrate, wherein the second pressure is lower than the first pressure, and the second distance is greater than the first distance;
   heating the substrate to form an organic functional layer; and
   forming a counter electrode above the organic functional layer.

2. The method of claim 1, wherein
   the first pressure is $1 \times 10^4$ Pa to $5 \times 10^4$ Pa, and
   the first distance is 2 mm to 10 mm.

3. The method of claim 2, wherein
   the second pressure is $1 \times 10^{-1}$ Pa, and
   the second distance is 30 mm to 70 mm.

4. The method of claim 2, wherein
   a ratio of the first distance to a width of a range including the column banks on the substrate is 5/2000 to 5/100.

5. The method of claim 1, wherein
   the pressure of the atmosphere reaches the first pressure in a time from 1 sec after start of the reduction of the pressure of the atmosphere to 300 sec at a maximum after the start.

6. The method of claim 1, wherein
   the reducing of the pressure of the atmosphere to the first pressure promotes levelling of the ink applied onto the substrate, and
   the reducing of the pressure of the atmosphere to the second pressure promotes evaporation of solvent of the ink.

7. The method of claim 1, wherein
   the rectifying plate is disposed opposite the column banks.

8. The method of claim 1, wherein
   a height of the rectifying plate relative to the substrate is varied by an elevation unit.

* * * * *